US006665111B2

(12) United States Patent
Sundaram

(10) Patent No.: US 6,665,111 B2
(45) Date of Patent: Dec. 16, 2003

(54) LASER BEAM STEERING SYSTEM

(75) Inventor: Mani Sundaram, Nashua, NH (US)

(73) Assignee: Teraconnect, Inc., Nashua, NH (US)

( * ) Notice: Subject to any disclaimer, the term of this patent is extended or adjusted under 35 U.S.C. 154(b) by 0 days.

(21) Appl. No.: 10/145,073

(22) Filed: May 13, 2002

(65) Prior Publication Data

US 2002/0168134 A1 Nov. 14, 2002

Related U.S. Application Data

(60) Provisional application No. 60/290,377, filed on May 11, 2001.

(51) Int. Cl.[7] .............................. G02F 1/29; G02F 1/00; H01S 3/113; H01S 3/10
(52) U.S. Cl. ......................... 359/299; 359/321; 372/11; 372/26
(58) Field of Search ................................ 359/299, 321; 372/11, 26; 385/16

(56) References Cited

U.S. PATENT DOCUMENTS

| | | | |
|---|---|---|---|
| 4,737,028 A | 4/1988 | Smith .................... 356/139.08 |
| 5,222,071 A | 6/1993 | Pezeshki et al. .............. 372/26 |
| 5,249,075 A * | 9/1993 | Delacourt et al. .......... 359/248 |
| 5,420,875 A | 5/1995 | Sternklar ....................... 372/9 |
| 5,539,206 A | 7/1996 | Schimert ................. 250/338.4 |
| 5,570,386 A | 10/1996 | Capasso et al. ............... 372/46 |
| 5,627,852 A | 5/1997 | Sun et al. ..................... 372/50 |
| 5,886,670 A | 3/1999 | Manasson et al. .......... 343/772 |
| 5,977,911 A | 11/1999 | Green et al. ................ 342/375 |
| 6,054,718 A | 4/2000 | Dodd et al. ................... 257/10 |
| 6,091,751 A | 7/2000 | Berger .......................... 372/45 |
| 6,356,674 B1 | 3/2002 | Davis et al. ................ 359/238 |
| 2002/0168134 A1 * | 11/2002 | Sundaram .................... 385/16 |

OTHER PUBLICATIONS

S.L. Chuang and D. Ahn, "Optical Transitions in a Parabolic Quantum Well with an Applied Electric Field", Journal of Applied Physics, vol. 65, No. 7, pp. 2822–6, Apr. 1, 1989.*
Berger, V. et al., Triple Quantum Well Electron Transfer Infrared Modulator, Appl. Phys. Lett., Oct. 26, 1992, pp. 2072–2074.
Martinet, E. et al., Electrical Tunability of Infrared Detectors using Compositionally Asymmetric GaAs/AlGaAs Multi-quantum Wells, Appl. Phys Lett., Feb. 17, 1992, pp. 895–897.
Martinet, E. et al., Switchable Bicolor Infrared Detector Using Asymmetric GaAs/AlGaAs Multiquantum Well, Appl. Phys. Lett., Jul. 20, 1992, pp. 246–248.
Berger, V. et al., Switchable Bicolor Infrared Detector using an Electron Transfer Infrared Modulator, Appl. Phys. Lett., Oct. 19, 1992 pp. 1898–1900.
Duboz, J.Y. et al., Grating Coupled Infrared Modulator at Normal Incidence Based on Intersubband Transitions, Appl. Phys. Lett., Mar. 24, 1997, pp. 1569–1571.
Chen, Weiquan et al., Intersubband Transitions for Differently Shaped Quantum Wells Under an Applied Electric Field, Appl. Phys. Lett. Mar. 30, 1992, pp. 1591–1593.
Grave, I. et al., Voltage–Controlled Tunable GaAs/AlGaAs Multistack Quantum Well Infrared Detector, App. Phys. Lett., May 11, 1992, pp. 2362–2364.

(List continued on next page.)

Primary Examiner—David N. Spector
(74) Attorney, Agent, or Firm—Maine & Asmus

(57) ABSTRACT

An array of devices for electronically steering a laser beam. A plurality of quantum well absorption modulators steer a laser beam, either reflective or transmissive, without moving parts and operable at room temperature. The foregoing is accomplished using intraband, also termed intersubband, transitions in the quantum wells.

16 Claims, 24 Drawing Sheets

OTHER PUBLICATIONS

Vodjani, N. et al., Tunneling Assisted Modulation of the Intersubband Absorption in Double Quantum Wells, Appl. Phys. Lett., Jul. 29, 1991, pp. 555–557.

Mii, Y. J. et al, Large Stark Shifts of the Local to Global State Intersubband Transitions in Step Quantum Wells, Appl. Phys. Lett., May 14, 1990, pp. 1986–1988.

Mii, Y. J. et al., Observations of Large Oscillator Strengths for Both 1–2 and 1–3 Intersubband Transitions of Step Quantum Wells, Appl. Phys. Lett., Mar. 12, 1990pp. 1046–1048.

Holm, David A. et al., Infrared Phase Modulators with Multiple Quantum Wells, Journal of Quantum Electronics, Nov., 1989, vol. 25, No. 11, pp. 2266–2271.

Parihar, S. R. et al., Voltage Tunable Quantum Well Infrared Detector, Appl. Phys. Lett., Dec. 4, 1989, pp. 2417–2419.

\* cited by examiner

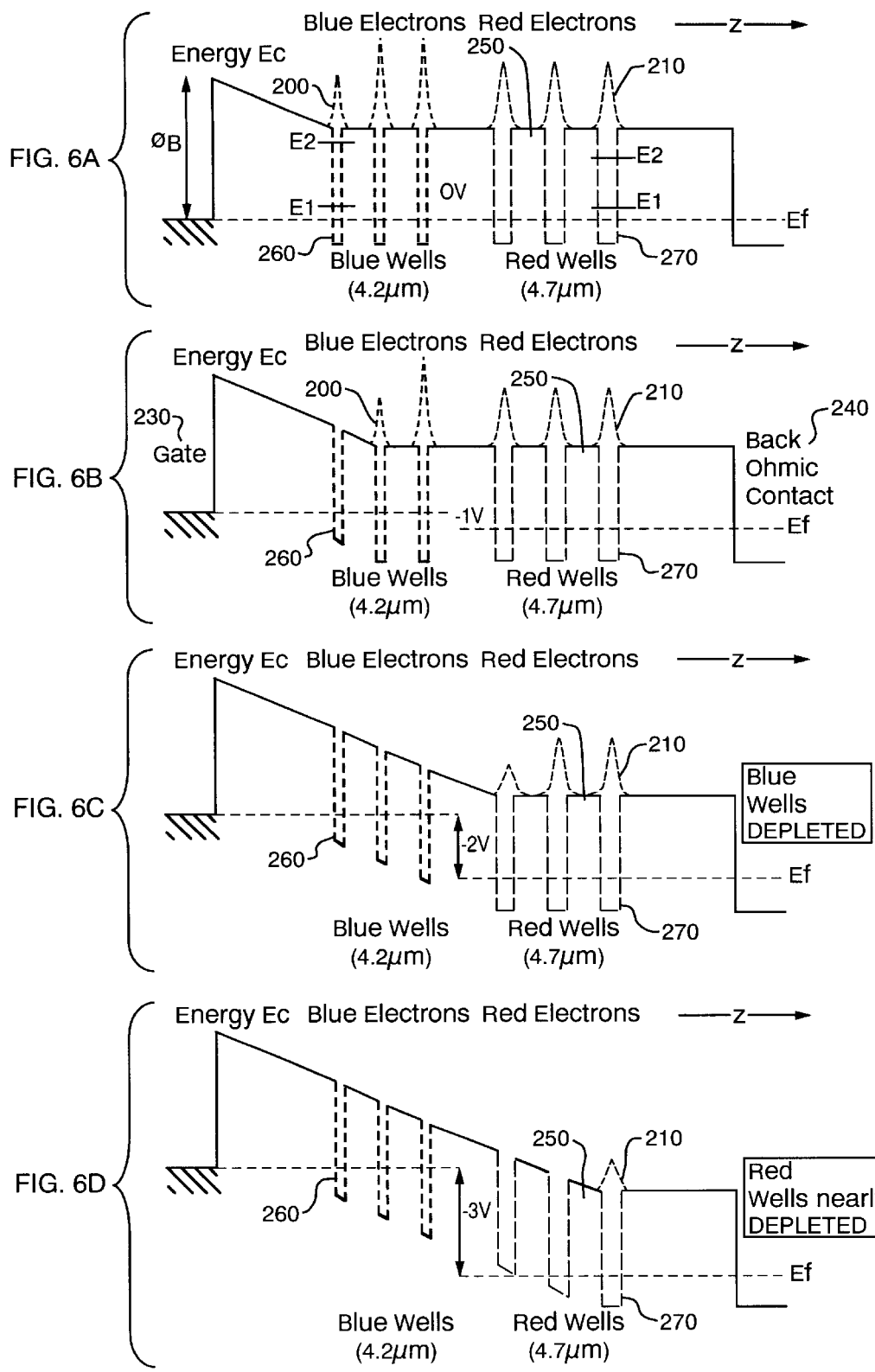

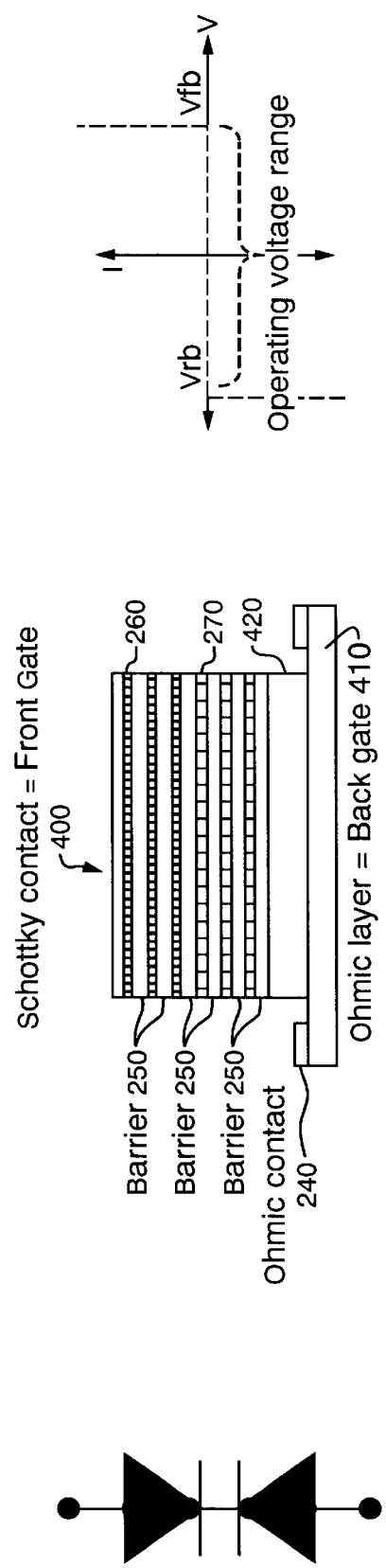

LASER BEAM STEERING SYSTEM

CROSS REFERENCE TO RELATED APPLICATIONS

This application claims priority under 35 USC Section 119(e) to Provisional Patent Application serial No. 60/290,377 filed May 11, 2001, which is incorporated herein by reference for all purposes.

STATEMENT OF GOVERNMENT INTEREST

Portions of the present invention were made in conjunction with Government funding under contract number N66001-00-C-8087, and certain rights to the Government are hereby acknowledged.

BACKGROUND OF THE INVENTION

1. Technical Field of the Invention

This present invention relates to a laser beam steering system operable with no moving parts and functional at room temperature.

2. Background Art

The advantages of deflecting and steering optical signals is well known. There are numerous products and industries employing reflected, deflected and steered laser beams for applications such as scanners, laser printer, and laser etching, and in general to the telecommunications and medical industry. Routing laser signals is also useful for a variety of military applications such as counter-measures, range finding, multi-target designation and guidance.

Devices for directing an optical beam or the spatial patterns of illumination produced by lasers have generally been restricted to mechanical methods, such as galvanic mirrors and various mirro/gimbal combinations. The prior art includes many mechanical mirror scanning, acousto-optic and electro-optic methods and apparatus for steering of laser beams, and, the disadvantages of the mechanical methods being bulky, slow, expensive, and relatively inaccurate, and highly susceptible to vibrations and misalignment.

Spatial light modulators are devices having optical properties of the material that are spatially controlled. These light modulator are typically very large compared to the wavelength of light, and have therefore been impractical for obtaining diffraction patterns. Advances in semiconductor technology allow the use of quantum well devices to make smaller spatial light modulators where diffraction effects dominate. These quantum well devices have fast response times, and can be made lithographically using standard fabrication equipment. There has been on-going efforts to create beam steering devices using modulators to eliminate the mechanical devices of the prior art. The optical modulators devices can work in transmission mode, where the light passes directly through the quantum well region, or in reflection mode, where external or integrated mirrors are used to enhance reflectivity changes and contrast.

The prior art has addressed the aspects of light altering the complex refractive index of a semiconductor material, wherein the intensity of an optical wave changes the complex refractive index of Si, GaAs, InGaAsP and other semiconductors in the microwave range (1 mm–1 cm) and infrared (IR) range (1.0 .mu.-100 .mu.). Light induced modulation of both the real and imaginary parts of the refractive index occurs, wherein the real part controls phase and the imaginary part controls amplitude of the modulated electromagnetic field. The real part is primarily responsible for changes in IR waves and the imaginary part for changes in millimeter waves (MMW). This effect is described by Drude theory and involves carrier induced changes in the complex permittivity of metals and semiconductors when illuminated by light.

Under this principle, devices that alter the phase of lightwaves by illumination of semiconductors with a second control lightwave have been developed. In particular, various forms of optical phase modulators have been developed. For example, optically controlled spatial light modulators based on semiconductor materials have been demonstrated. In such an spatial light modulators, optically induced changes in the semiconductor material affect an adjacent layer of electromaterial which in turn affects an EM wave propagating through the electro-optic material.

While spatial light modulators devices transmit some two-dimensional patterns through an optical wave, phased array antennas transmit EM waves in a particular direction in the microwave region without moving parts. A phased array is a network of radiating elements, each of which is usually non-directive but whose cooperative radiation pattern is a highly directed beam because constructive interference occurs between radiating elements. Whereas previous radar antennas had to be mechanically steered for beampointing, the phased array antenna achieves the same effect electronically by individually changing the phases of the signals radiating from each element. Narrow angular band beams can be formed by simply driving each element of the array with an appropriately phased signal. Moreover, electronic steering is much faster and more agile than mechanical beam steering and can form several beam lobes and nulls to facilitate multiple target tracking or other functions such as anti-jamming. The flexibility of electronic steering afforded by phased array radars comes at the cost of individual control of each element. The N elements of the antenna are driven with the same signal but each with a different phase. In practice, a single signal is equally split into N signals to feed the elements, and a phase shifting network, such as those using ferrites or diodes, is provided for individual phase control of each element. For large arrays (i.e., N>100), the complexity of the power splitting network and the cost of providing N phase shifters can become quite high, not to mention the bulkiness of the necessary waveguide plumbing. Moreover, for very large arrays, the computation required to calculate the array phase distribution for a desired radiation pattern is a serious burden.

Phased array antenna theory is based on Fourier optics in general and the theory of diffraction gratings in particular. It is well known from Fourier optics that the optical beam is diffracted in a particular direction if the phase difference between the particular optical rays is a multiple of the wavelength of the optical beam.

With respect to phased array radars, photonic architectures are typically characterized as either optically coherent or non-coherent. Optically coherent architectures are considered impractical because of the thousands of optical signals that must be phase locked.

Military Applications include targeting/guidance and countermeasures systems. The countermeasures system seeks to protect military personnel and property from hostile threats such as missiles, aircraft and helicopters that employ laser tracking systems such as precision guided munitions and other electro-optical guided munitions. For example, a missile with a sensor uses acquisition electronics to home in on a target, such as F22 or F16 aircraft. The aircraft usually has sensors for countermeasures and knows of the missile tracking the aircraft. Thus, missile sees aircraft and aircraft sees missile. The primary function of the aircraft countermeasures system is to blind or distort the missile sensor.

The missile sensor typically operates in the 3–5 micron wavelength range, and the countermeasures systems tries to blind the missile by scanning a pattern with a signal intended to overload or saturate the missile electronics. The aircraft uses a countermeasures laser that operates in the 3–5 micron range and this laser shoots a laser beam at the missile in an attempt to blind the tracking sensor. It is not enough to have a static laser beam that strikes only a portion of the missile, and the countermeasures laser must be scanning or rastering all around the missile threat.

Prior art systems use a camera or other sensor to track the in-coming target and the countermeasure laser mechanically illuminates and tracks the missile using a mirror and gimbal technique. The camera and gimbal are computer controlled in an attempt to focus the laser on the missile by continuously adjusting the mirror by the gimbal. This mirror and gimbal combination is not highly reliable and subject to numerous errors and malfunctions. The stabilization and maintenance of a line of sight on the threat is exceedingly difficult with such a system especially in conditions of excessive vibrations and air turbulence. There are considerable alignment problems with the mirror and gimbal system that make the system inoperable if out of alignment. The gimbal is typically a hydraulic system and the system relies upon the gimbal being able to quickly respond to commands to track the movement of the incoming missile threat.

In addition to being unreliable, the prior art system has additional disadvantages in terms of weight and size. The gimbal system occupies valuable real estate aboard military aircraft and is fairly heavy. Furthermore, the mirror gimbal combination is relatively expensive.

A prior art approach to laser guided targeting system is disclosed in U.S. Pat. No. 4,737,028. This prior art system comprises a sensor system capable of tracking both the target in one band and the laser designator in another band. This patent describes the prior art steering mirror control with the camera processing.

In U.S. Pat. No. 5,222,071, a dynamic optical grating device is described using a semiconductor device to steer laser beams. This invention involves interband electron flow between two bands.

U.S. Pat. No. 5,305,123 describes a light controlled spatial and angular electromagnetic wave modulator. Periodic perturbations of the dielectric field in the surface of a semiconductor material are induced by an optical control pattern, which causes electromagnetic waves to be coupled out of the semiconducting material in a particular direction depending upon the period of the perturbations. Rapid variations in the period of the perturbations are induced by controlling the optical control pattern. By rapidly changing the period of the perturbations, the device can be used to control the direction of the reflected/transmitted beam and beam steering and forming can be achieved.

What is needed is a system for electronically steering laser beams that do not involve mechanical gimbals or external mirrors. In order to be practical, such a system should operate at room temperature without requiring thermal conditioning. The beam steering system should be easily fabricated using reliable and inexpensive methodologies, with flexibility to allow the designer various options and customization. The system should allow both transmission and reflection of the light signals depending upon the application and

SUMMARY OF THE INVENTION

The invention is devised in the light of the problems of the prior art described herein. Accordingly it is a general object of the present invention to provide a novel and useful apparatus and technique that can solve the problems described herein.

An object of the present invention is an integrated circuit or chip that does the same function of the gimbal/mirror combination but without the aforementioned problems. The present invention rasters the laser beam without using mechanical means. A voltage or other electrical parameter is changed by sweeping the voltage through the chip to scan the laser beam without a mirror or gimbal.

The present device operates as a mirror in reflection mode and an optical medium in transmitter mode. In the reflection mode, the laser beam is reflected by the chip in a manner to steer the reflected laser output beam by varying the voltage of the chip. This is the functional equivalent of the mirror, with no moving parts. Alternatively the present invention also allows a transmitting function operable with an optical medium, wherein the transmitted laser beam through the other side of the chip is steered according to the applied voltage. Such a configuration is not possible with the classic mirror designs.

Different schemes exist in the prior art, however the present invention provides significant benefits and is distinguishable. For example, U.S. Pat. No. 5,222,071 describes a dynamic grating device that uses applied voltage for beam steering. However, the '071 invention performs all electron distribution using interband transmissions, whereas the present invention accomplishes the electron distribution in a single band. Such a single band electron distribution is termed intraband or intersubband transitions. The implementation of the intraband electron distribution is a better implementation and provides cleaner transitions.

In one embodiment the present invention is manufactured or built as an optical modulator. For example, in a chip with a whole number of devices, a 256×256 array with a 15 micron pitch connected in a massively parallel fashion using hybridization technology to interconnect to the drive circuitry. The size of the array may vary depending upon the specific application and circumstances.

An object of the invention is a laser beam steering device to steer an infrared laser beam, comprising at least one optical absorption modulator formed on a substrate and having a quantum well doped with electrons. The laser beam being incident on the modulator, wherein discrete voltage signals applied to the modulator control an exit angle of one or more exit beams from the modulator, and wherein the modulator operates using intersubband transitions in the quantum wells.

A further object includes the optical beam steering device, wherein the substrate is an application specific integrated circuit (ASIC) with integrated drive circuitry electrically coupled to the modulator. It also includes the optical beam steering device, wherein the modulator is formed as a one dimensional array or two dimensional array of modulators.

In addition, the optical beam steering device, wherein the modulators form a transmission array wherein the laser beam travels through the transmission array. Alternatively, the optical beam steering device, wherein the at least one modulator forms a reflection array wherein the laser beam is at least partially reflected from the reflection array.

Another object is the optical beam steering device, further comprising a microcontroller and/or a memory section coupled to the modulator for processing the voltage signals for applying voltage patterns.

An object of the invention is an electrically steerable laser system for countermeasures, comprising an input laser signal, an array of optical absorption modulators, at least one input optical device coupling the laser signal to the optical modulators, an electronic control section for producing a voltage pattern to the modulators, wherein the voltage pattern operates in an intersubband transition to steer the input laser signal and produce a steered laser beam, and at least one output optical device coupled to the array and outputting the steered laser beam.

An object also includes an all optical switching system, comprising an input fiber optic
- bundle having input optic signals;
- an array of optical absorption modulators;
- at least one input optical device coupling said input optic signals to said optical modulators;
- an electronic control section for producing a voltage pattern to said modulators, wherein said voltage pattern operates in an intersubband transition to steer said input optic signals and produce a steered optical output;
- an output fiber optic bundle having output optic signals; and
- at least one output optical device coupled to said array and said output fiber optic bundle.

Still other objects and advantages of the present invention will become readily apparent to those skilled in this art from the following detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements, and in which:

FIGS. 12a–c show the use of an insulator in addition to the back gate to extend the forward breakdown region

DESCRIPTION OF THE PREFERRED EMBODIMENT

The methods and embodiments of the laser beam steering system are disclosed herein that enables a laser beam to be steered electronically. The preferred embodiments are just an illustration of the techniques that are applicable to many variations and applications all within the scope of the invention.

Figure 1:
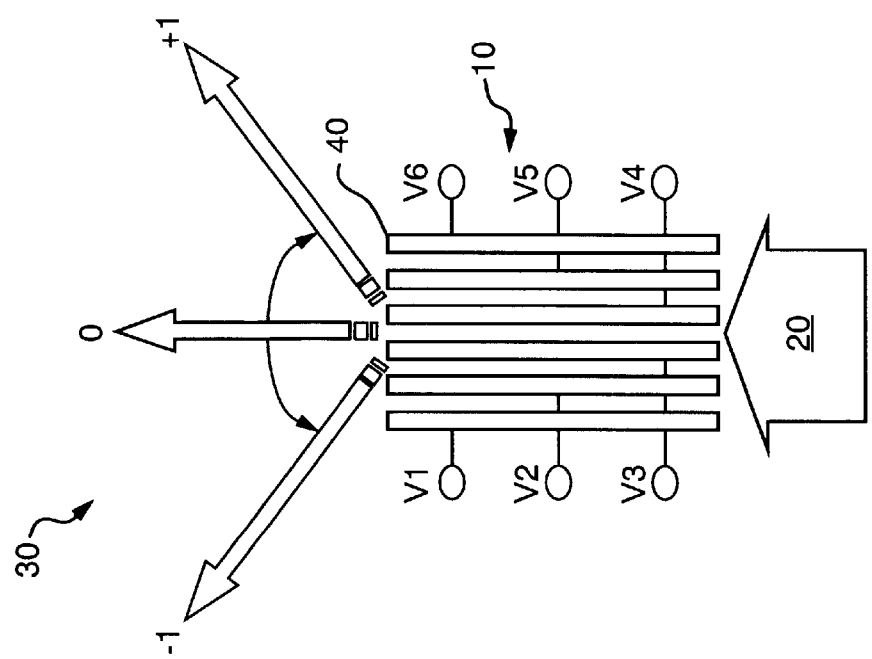
FIG. 1 shows the laser beam steering device in a transmitter mode, wherein the input laser beam proceeds through the device and is steered the applied voltage to the devices

Referring to FIG. 1, which shows the transmission array for the steerable laser beam system 10. The input laser beam 20 is introduced to the laser beam steering chip 10, wherein the input laser beam 20 can be from a laser source or an incoming laser signal from another source, and multiple output beams are produced. The beam 20 is generally a coherent laser beam that is beam expanded and flooding the entire face of the chip 10. The chip 10 has a plurality of voltage access points V1–V6, (one voltage for each device in the array, 6 voltages for a 6-element array), that connect to the individual devices 40. Each of these voltages V1–V6 affects the angle of the laser output beam 30, wherein θ=f(V), which means that the angle of each ouput beam is a function of the applied voltage pattern. There can be other optical coupling devices to filter or channel the light as is known in the art.

There are several methods for accomplishing the transmission mode beam steering device. The ASIC substrate may be transparent and allow the light to pass through the device. Alternatively, the ASIC could be connected by wires to the devices, thereby allowing non-transparent substrate materials such as Silicon. The devices resemble a bunch of linear elements like fingers that steer the laser beam according to the corresponding voltage pattern.

The output beams are designated 0, +1 and −1 representing three distinct beams that are steered according to the applied voltages. The voltage points V1–V6 are electrically coupled to drive circuitry on the underlying substrate (not shown). It should be appreciated that the three beams are merely for illustrative purposes and may be any number of beams.

Figure 2:
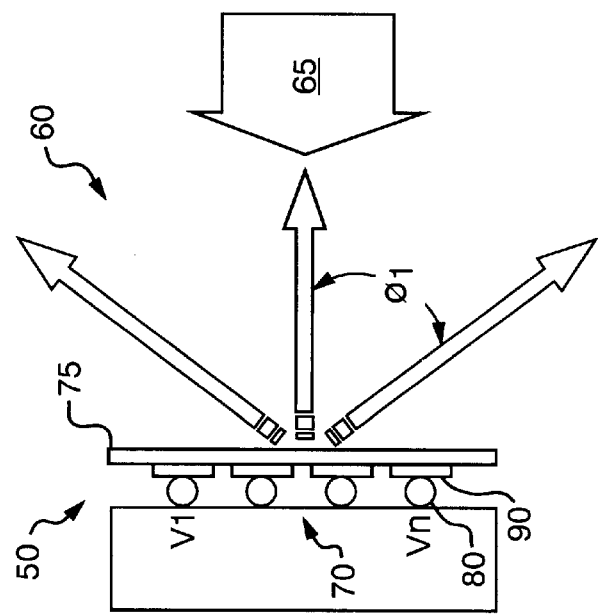
FIG. 2 shows the laser beam steering device in a reflective mode, wherein the reflected beams are steered by the applied voltage to the devices

Referring to FIG. 2, the reflection array for the laser beam steering chip is detailed. In the reflection mode, the input laser beam 65 is reflected by the laser beam steering chip 50 and the reflected output beam 60 is controlled by the individual voltages Vl–Vn. The array 75 having a plurality of devices 90 is bump bonded 80 to the substrate 70 with the drive circuitry (not shown) embedded in the substrate 70 that applies the bias voltages to the devices 90. The voltage from the substrate drive circuitry is applied as discrete steps according to the desired results.

Figure 3B:
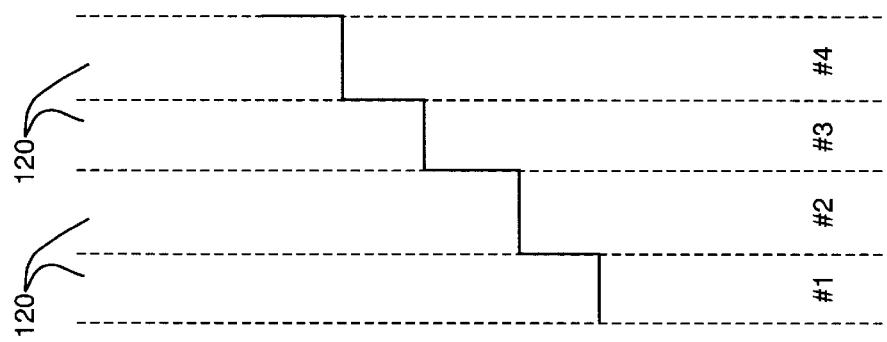
FIG. 3b is a graphical representation of a linear voltage gradient for a phase modulation application
Figure 3A:
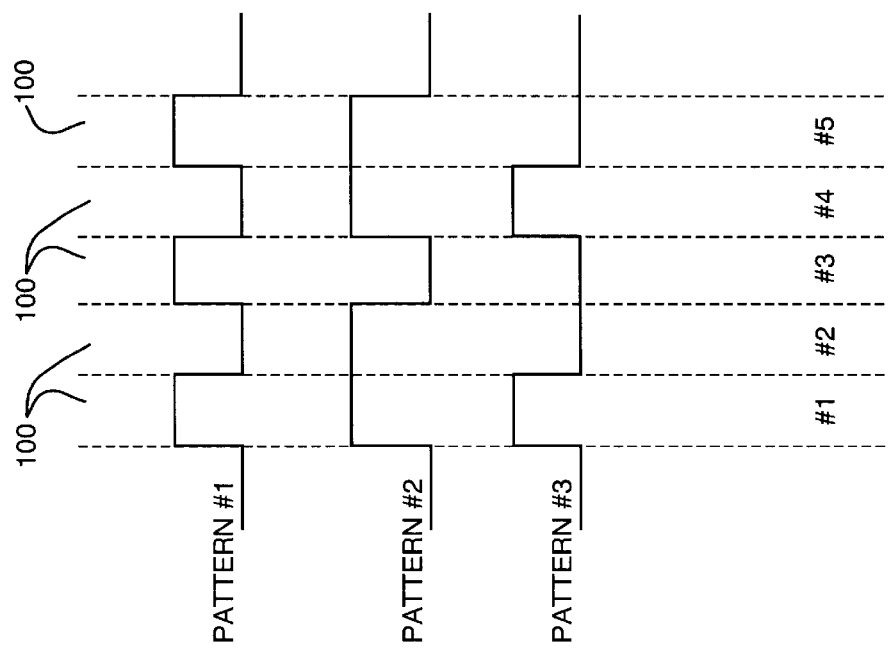
FIG. 3a is a graphical representation of several voltage patterns for an amplitude modulation application

Referring to FIGS. 3*a* and 3*b*, possible embodiments of voltage patterns are shown. For illustrative purposes, a simple amplitude modulator example shown in FIG. 3*a* is provided using a one-dimensional array with devices #1 to #5 (100). It should be understood that the devices 100 have small gaps (not shown) separating the devices.

The modulator array has a plurality of devices 100 that reflect or absorb lights depending upon the applied voltage. By sequentially applying 'on' and 'off' voltage levels, a diffraction grating is created with the varying devices reflecting or absorbing the light. This is amplitude modulation of the input laser beam, wherein the devices either completely absorb or reflect the optical light.

Referring again to FIG. 2, the reflected beam has a zero-th order mode beam that is a direct reflection along with a plurality of reflected beams (called diffraction modes), wherein the diffracted scattered beams are +1 mode, −1 mode, +2 mode, −2 mode . . . +n mode, −n mode. The angular and intensity distribution of this diffraction pattern is created by the specific voltage pattern impressed on the array. As shown in FIG. 2, the angular difference between the zero-mode beam and the +1 mode beam is labeled $\theta_1$.

A different voltage pattern can be impressed, where the first device can have a +5V (on) and the next two devices have 0 volts (off), with the pattern repeated for the remaining devices in the array. The pitch of the diffraction grating is thus changed. The angle between the zero-tolerance and the +1 mode is therefore changed.

Pattern #1 is a simple digital pattern '10101' for each device #1–#5 respectively. Pattern #2 shows a pattern represented as '11011', while pattern #3 is represented as '10010'.

The diffraction angle is calculated according to the Bragg condition as is known in the art:

$$a \sin \theta_n = n\lambda$$

a=grating pitch
$\lambda$=laser wavelength
n=0, +1, −1, +2, −2, . . .
For the +1 mode, n=1, and $$\theta_1 = \sin^{-1}(\lambda/a) = \sin^{-1}(\lambda/id)$$

i=periodicity in the applied voltage pattern
d=device pitch (e.g. 15 microns)
For a voltage pattern of '10101010 . . . ' i=2 in the above equation and is the smallest value of i that can be applied. If the pattern is changed to '110110110110 . . . ' or '100100100100 . . . ', the periodicity i in either case is i=3, and the diffraction angle $\theta_1$ changes according to the Bragg condition above. The only difference between the two cases then is not the diffraction angle, but the intensity of the diffraction modes since the duty cycle of the grating is different, i.e. the ratio of HIGH (REFLECTIVE) to LOW (ABSORPTION) portions of the grating within the grating period is different. The pitch will be some multiple of the granularity of the devices. For example, if the devices of the array are spaced at 15 microns, the pitch will be 15 microns or 30 microns or 45 microns, or some other multiple of 15 microns.

The above refers to a line or 1-dimensional grating that provides beam steering in one direction only, along the axis perpendicular to the grating. Steering in two dimensions is readily accomplished with a 2-dimensional array of devices, in which case the Bragg condition is satisfied when:

$$\sin \theta_{mn} = \lambda[(m/a)^2 + (n/b)^2]^{1/2}$$

$\theta_{mn}$=diffraction angle of mode (m,n)
a=grating pitch in x direction
b=grating pitch in y direction
$\lambda$=laser wavelength
(m,n)=(0,0), (1,0), (0,1), (1,1), (2,0), . . .

As in the 1-dimensional case, a and b are voltage controlled with a=id, and b=jd, where d is the device pitch, and i and j are the x and y periodicities in the impressed voltage pattern. It is clear that for every diffraction mode (m,n), a wide range of diffraction angles can be secured by controlling i and j with voltage.

Each angle $\theta_{mn}$ is adjustable as detailed herein and programmable according to the applied voltage pattern. Every mode is adjustable with the exception of the zero reflected beam. Therefore the present invention creates a dynamic diffraction grating wherein the pitch of the grating is electronically controlled by the applied voltage pattern.

For further illustration, if the modulator is a binary device, at +5 volts (for instance) the device reflects and at 0 volts (for instance) the device absorbs. In the ideal representation, a digital square wave pattern is created with the width of the 'high' pulses, the width of the 'low' pulses, and the periodicity of the pulse pattern controllable electronically by the applied voltage pattern.

Commercial applications of the present invention include cross connect switches wherein an all optical switching is possible. In telecommunications systems, there are a plurality of optical fibers on an input connector and a plurality of optical fibers on an output connector. The ideal cross connect switch allow the light from any optical fiber at the input to pass into any of the fibers on the output. The present standard performs an optoelectronic conversion to convert the optical signals to electronic signals, perform the switching, and retransmit the optical signals. There are efforts to utilize silicon chip based micro mirrors to take light and direct it from one fiber to another fiber using the mirrors. There are obvious difficulties in implementation of the micro mirror technology, one of which is the switching speed that is of the order of a few milliseconds. As a fast (nanosecond switching speed) voltage controlled mirror, the present invention allows an all optical switching device.

A disadvantage of the amplitude modulator is the efficiency. If the user is only interested in one of the diffracted beams of light, the other light beams are wasted. A phase modulator is a similar device that operates by applying a voltage gradient across the devices in the array to produce a phase gradient in the reflected beam. The amplitude of the light reflected off each of the devices is the same, but there is a phase difference between the reflected beams from the devices. This changes the phase front of the entire reflected laser beam causing it to be reflected at an angle determined by the phase gradient (which is voltage controlled). All the reflected energy is thus directed into this one 'mode', resulting in nearly 100% energy transfer, superior to an amplitude-modulated beam-steering chip. Like an amplitude modulator, the phase modulator can also be operated in transmission mode.

There are many applications requiring greater efficiency, wherein the phase modulator scheme would be preferred. While the amplitude modulator may have efficiencies around 50%, the phase modulator scheme may get closer to 100%.

For example, the zero-tolerance beam is directly reflected by a device with zero degrees phase. The next beam is reflected from the next device with the same amplitude, but with a 1 degree phase difference. The next beam is reflected from the next device with a 2 degree phase difference.

Referring to FIG. 3b, a linear voltage pattern is applied to adjacent devices #1 to #4 (120) of an array. The voltage of device #1 starts at zero and each device increases by a set amount, for example 1 volt for device #2, 2 volts for device #3 and 3 volts for device #4, etc. The voltage pattern causes the modulator array to reflect the input laser beam so that the amplitude of the reflected beam is the same for all reflections, but each reflection has a distinguishable phase difference. Depending on device design details, the relationship between voltage and phase may be more complex than the simple linear one presented here. In any case, the relationship is known both theoretically and experimentally for a given device design, and the appropriate voltage pattern can be applied to secure the desired phase pattern.

The voltage patterns can be applied from a microcontroller that interacts with the beam steering chip and process voltage patterns depending upon the conditions and calculated dynamically. The voltage patterns can also be stored in memory and re-applied when desired. The application of the voltage patterns and control circuitry are well known to those in the art and require little explanation.

Having thus described the system entailing a modulator device for beam steering, the process of manufacturing the individual beam steering devices is detailed herein. The individual optical modulators of the present invention are devices that are responsive to applied voltage. The individual devices are formed into arrays that are coupled to light signals, thereby forming a dynamic mirror/grating.

The present invention may be constructed from an absorption modulator as the building blocks. Prior art reflective and transmissive devices reflect light using a mirror or absorb light through some medium. The present invention accomplishes the reflection without separate mirrors and performs absorption without a separate absorbing medium.

Figure 5:
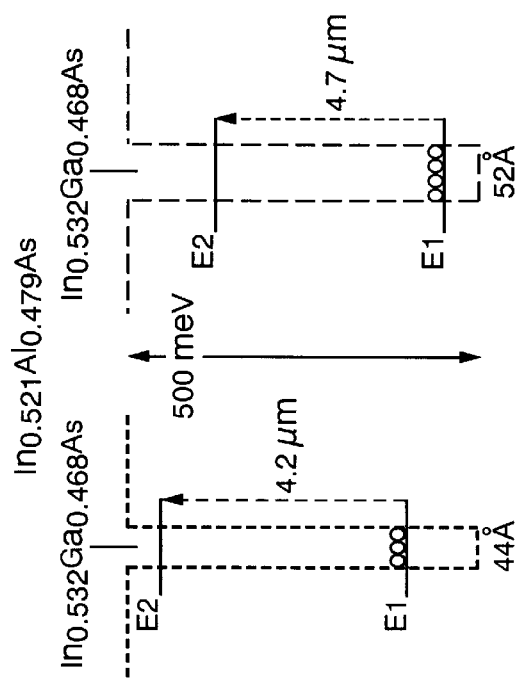
FIG. 5 shows the quantum well properties for the 4.2 microns wavelength and the 4.7 micron wavelength quantum wells FIGS. 6a–6d graphically illustrates the quantum well device in the Z direction from the Gate to the Back Ohmic Contact and the depletion characteristics at various voltages
Figure 4:
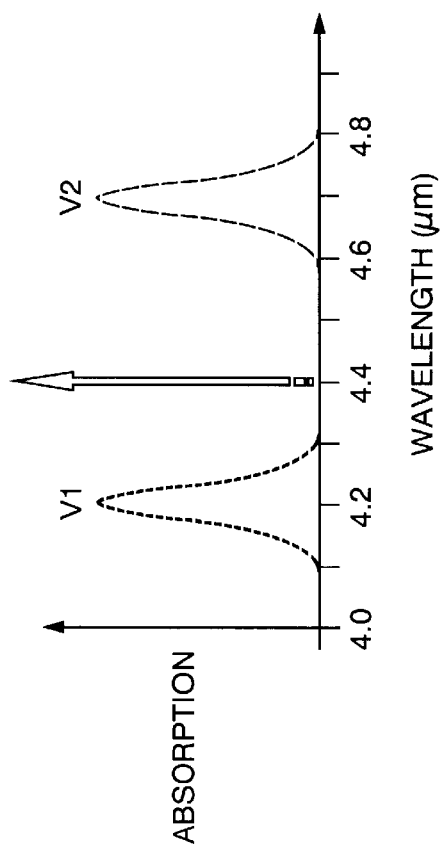
FIG. 4 is a waveform illustrating the absorption curves for two wavelengths of a phase modulation application

Refer to FIGS. 4 and 5, which depict a graphical representation of the absorption waveforms for a phase modulation application. The axes are absorption versus wavelength and show that the device has an absorption spectrum that depends on the applied voltage. At voltage V1 all 4.2 micron light is absorbed and at voltage V2 all 4.7 micron light is absorbed. A laser beam at an intermediate wavelength (e.g. 4.4 microns) will experience a dramatic phase shift on being reflected from such a device. This phase shift depends on the actual voltage applied across the device. Note that the device itself does not absorb any of the laser light at 4.4 microns. It reflects the beam in its entirety, but changes the phase of the reflected beam by virtue of having an absorption peak on either side of the laser wavelength. The relationship between this absorption spectrum and the phase change produced at the laser wavelength is calculated through a Kramers-Kronig analysis, as is well known in the art.

It is apparent that for applications other than phase modulation, such as amplitude modulation, only a single absorption wavelength is necessary. For a laser beam at 4.4 microns, the device will have an absorption peak at 4.4 microns with a voltage-controlled absorption such that at a voltage V1 all 4.4 micron light is absorbed and at a voltage V2 no 4.4 micron light is absorbed (i.e. all the light is reflected). Partial absorption/reflection occurs at intermediate values of voltage.

In the 3–5 micron range for countermeasures applications, absorption is accomplished using intersubband transitions in quantum wells. Intersubband transitions have sharp absorption lines with spectral widths $\Delta\lambda/\lambda$ as low as 8%. On the other hand, interband absorption has undesirably wide spectral width and in the 3–5 micron wavelength range is hampered by the lack of a semiconductor system with the properties required to achieve voltage-tunable absorption.

Quantum well absorption of 3–5 micron wavelength is possible in one embodiment using lattice-matched InGaAs/InAlAs quantum wells on InP. It is also possible to have proper operational characteristics in another embodiment using strained InGaAs/GaAs/AlGaAs quantum wells on GaAs substrate.

The ability to change the quantum well absorption with applied voltage is possible by charge transfer to and from the quantum wells capacitively. An alternate method to tune quantum well absorption is called the Stark effect and relies on tuning the energy levels in the quantum well with voltage, thereby changing the absorption peak (which is equal to the separation between the two lowest energy levels). This effect is generally very small, particularly at non-cryogenic temperatures such as room temperature 300K, with the resulting absorption modulation too small to make a practical device.

An array of absorption modulators is formed on a substrate wherein the absorption spectrum changes with the voltage bias. The absorbers are inserted in the resonant cavity in a preferred embodiment. The absorption changes with the voltage per pixel; the phase changes with the voltage per pixel; the amplitude changes with the voltage per pixel (ideally zero); and therefore, the beam angle changes with an array voltage pattern.

While the present application primarily addresses the 3–5 micron wavelength, the principles apply to other wavelengths. In telecommunications applications operating in a communications C-band of about 1530–1560 nanometer wavelength or the L-band 1560–1620 nanometer wavelength, the principles are the same although this would not usually be done with intersubband transitions in quantum wells but preferably with interband transitions in quantum wells incorporated in other devices such as PIN diodes.

FIG. 5 shows the quantum wells for the 4.2 micron wavelength and the 4.7 micron wavelength lattice-matched to InP. The recipe or manufacturing properties for this quantum are well known in the art, however the prior art has heretofore not been able to control the depletion at room temperature as is accomplished in the present invention. The graphical depiction shows that absorption at a wavelength of 4.2 microns and at a wavelength of 4.7 microns can be realized with a 44 Angstrom wide quantum well and a 52 Angstrom wide quantum well, respectively, each well having two energy levels E1 and E2 separated by the required amount. For the 4.2 micron wavelength quantum well, the distance between E1 and E2 is 4.2 microns, while the distance between E1 and E2 of the 4.7 micron wavelength quantum well is 4.7 microns. These energy levels establish the energy gap and the bias voltage required for the electrons to be depleted from the well.

FIGS. 6a–6d and FIG. 7 illustrate the quantum well infrared modulator (QWIM) principle of operation. In particular, FIGS. 6a–6d show the device in the Z direction and the electron migration from the quantum wells as a function of applied voltage. The Blue Wells represent the 4.2 micron wavelength quantum wells and the Red Wells represent the 4.7 micron wavelength quantum wells. The Fermi energy (Ef) is the level at which the electrons rest and the device illustrates the wells between the gate and the back electrical ohmic contact.

In FIGS. 6a–6d, the Energy Band Gap diagrams illustrate the Z direction of the device perpendicular to the wafer. The 4.2 micron quantum wells 260 and 4.7 micron quantum wells 270 are sandwiched between the gate 230 typically a metal and the back ohmic contact 240, with the 4.2 micron quantum wells 200 closer to the gate 230. Each of the quantum wells 260, 270 are separated by a barrier 250. As illustrated, the 4.2 micron quantum wells 260 and more narrow than the 4.7 micron quantum wells 270 and each has respective E1 and E2 levels.

In one embodiment the device is fabricated with AlGaAs with wells of GaAs and the process involves growing a sandwich of AlGaAs/GaAs/AlGaAs/GaAs etc . . . Electrons in the GaAs are trapped between the differential on either side wherein the composition and the thickness of the layers are fabricated according to desired characteristics. The process involves doping the quantum wells with dopants, such as Silicon (Si), so there are electrons in the ground state of the quantum well.

When a photon strikes the quantum well with the right energy, which is the energy level corresponding to the separation between E1 and E2, the electron is excited up and absorption occurs. The higher level electrons eventually relax to the ground state when the photon energy ceases. When there is a constant stream of photons, it causes the electrons to remain at the higher state and constant absorption occurs. The characteristic shape representing the absorption at room temperature is not a delta function because of thermal effects, so the actually shape is more like a Lorentzian shape.

At zero volts of FIG. 6a, there are enough electrons in the wells for absorption of impinging photons in both the 4.2 micron quantum wells and 4.7 micron quantum wells, and the respective electron distribution curves for the 4.2 micron quantum wells 200 and 4.7 micron quantum wells 210 are shown.

With an applied voltage of −1 volts, as shown in FIG. 6b, the band diagram shifts and some of the electrons get out of the 4.2 micron quantum wells. The absorption properties by the 4.2 micron quantum wells decreases proportionally to the decrease in electrons resigning in those quantum wells. The 4.2 micron absorption peak 200 decreases.

At −2 volts, as shown in Figure all the electrons are depleted from the 4.2 micron quantum wells and the is no longer any absorption and the 4.2 micron peak absorption 200 ceases.

In FIG. 6d, at −3 volts, nearly the 4.7 micron quantum wells are being depleted and the peak absorption 201 is significantly decreased.

Figure 7B:
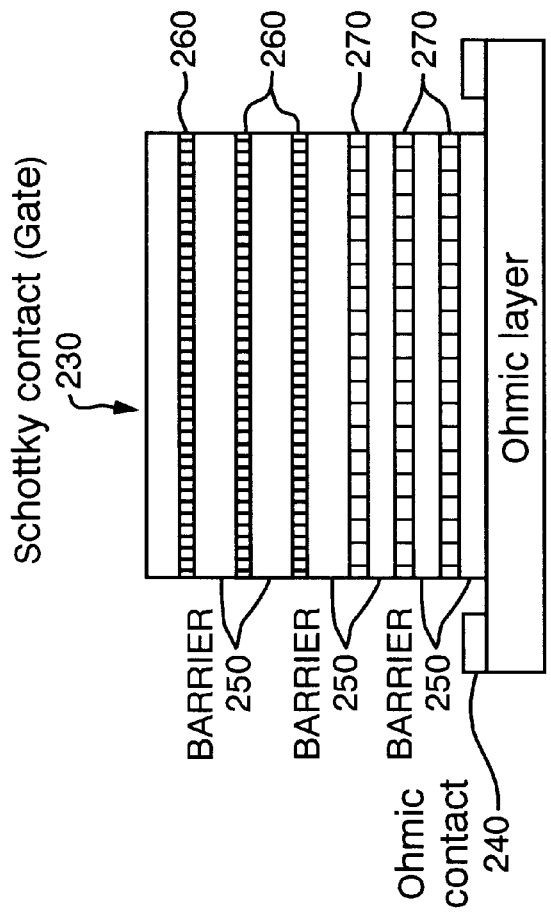
FIG. 7b shows the quantum wells integrated into the Shottky diode
Figure 7A:
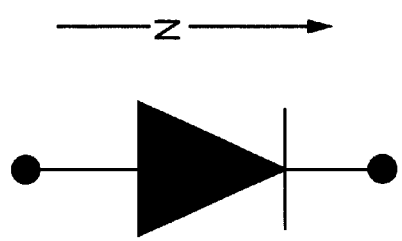
FIG. 7a is the electrical symbol for the Shottky diode to show the orientation

FIG. 7 shows the quantum wells integrated into a Shottky diode. The lowest level is the ohmic layer and the 4.7 micron wavelength quantum wells (Red Wells). There are barriers between each of the wells of the device to separate the wells. The 4.2 micron wavelength quantum wells (Blue Wells) are sandwiched between the Red Wells and the Shottky contact (Gate). The back metal contact is a low-resistance electrical contact to the ohmic layer. The Schottky diode is formed between the front metal (Gate) and the back metal (ohmic contact). The Shottky barrier depletion edge of the gate changes with voltage bias: with increasing negative voltage, the electrons are progressively swept out of the wells, more or less sequentially, starting at the gate end and proceeding toward the back contact end.

The present invention uses the depletion edge to sweep out electrons from the quantum wells one at a time. The construction of the device is based upon the principle that only quantum wells with electrons absorb photons, and the absorption spectrum is set by the quantum well parameters. The quantum wells are thus arranged for the desired absorption shift the voltage bias.

Figure 8:
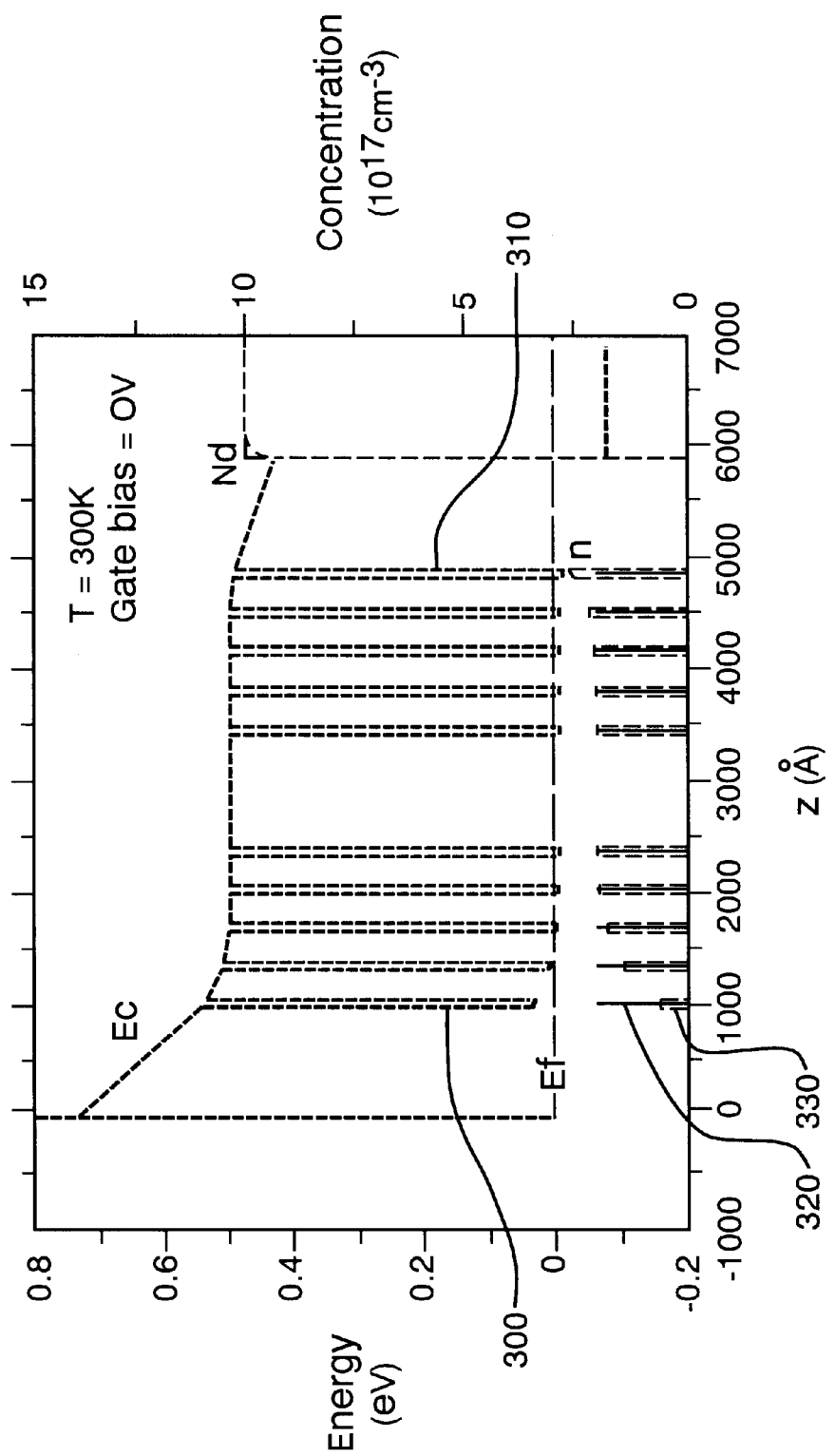
FIG. 8 is an exploded graphical depiction of a band diagram with a gate bias=0 volts showing the energy level (eV) versus depth of the device
Figure 9A:
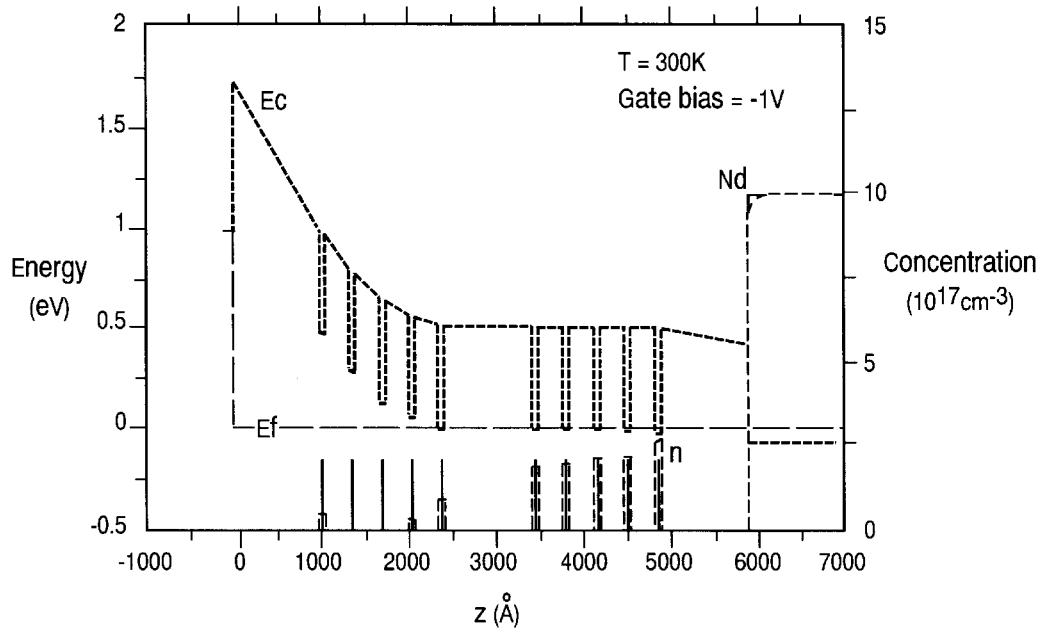
FIGS. 9a–f are band diagrams for various negative gate bias voltages illustrating the quantum well depletion
Figure 9B:
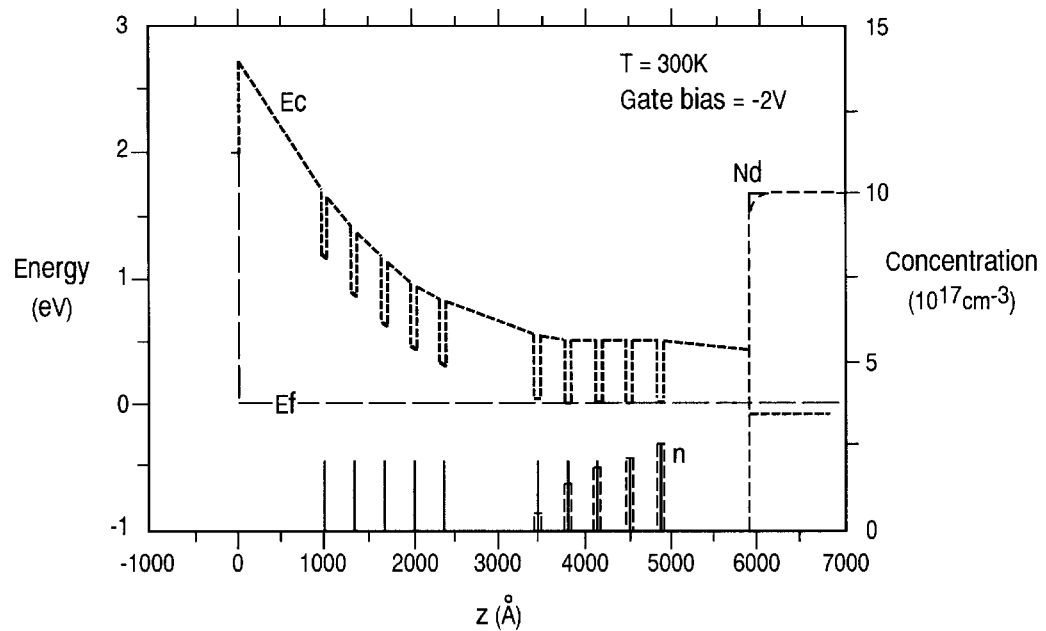
Figure 9C:
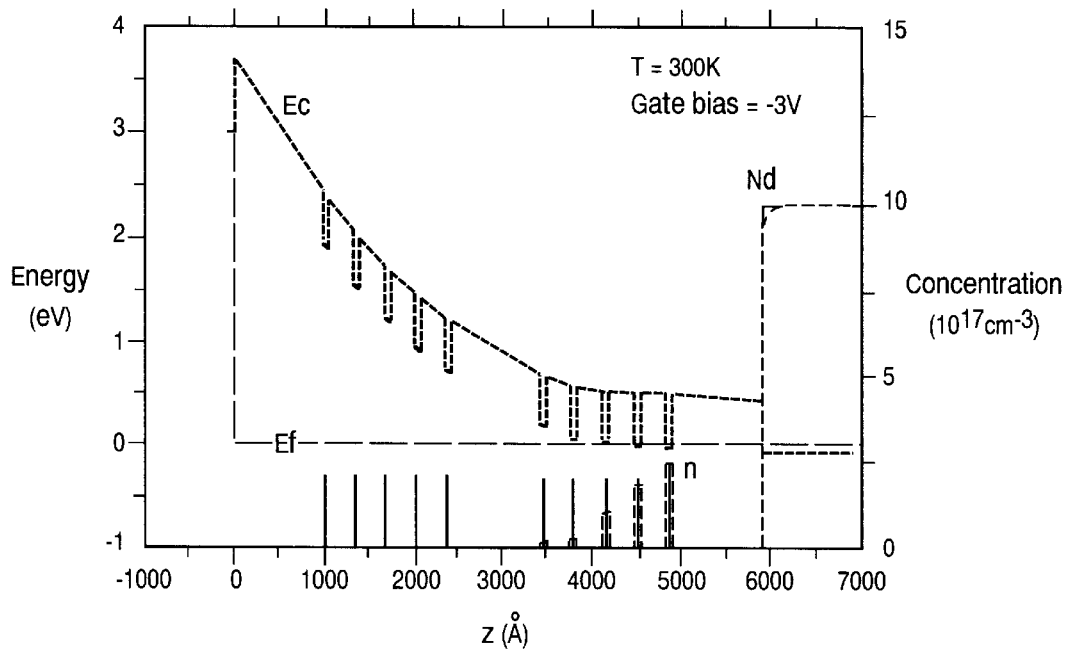
Figure 9D:
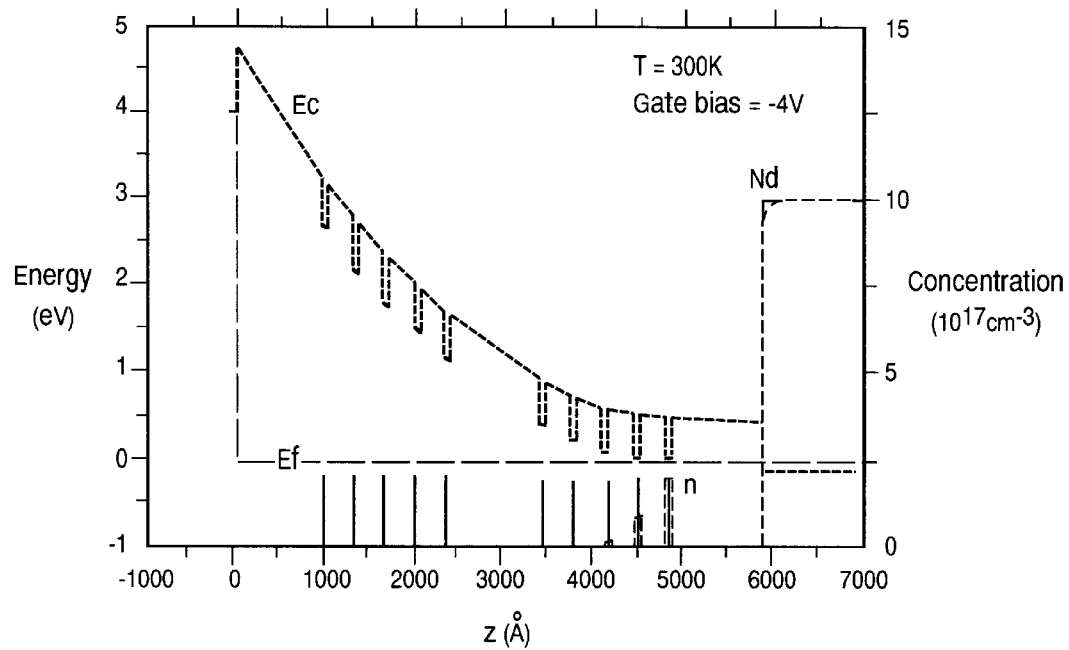
Figure 9E:
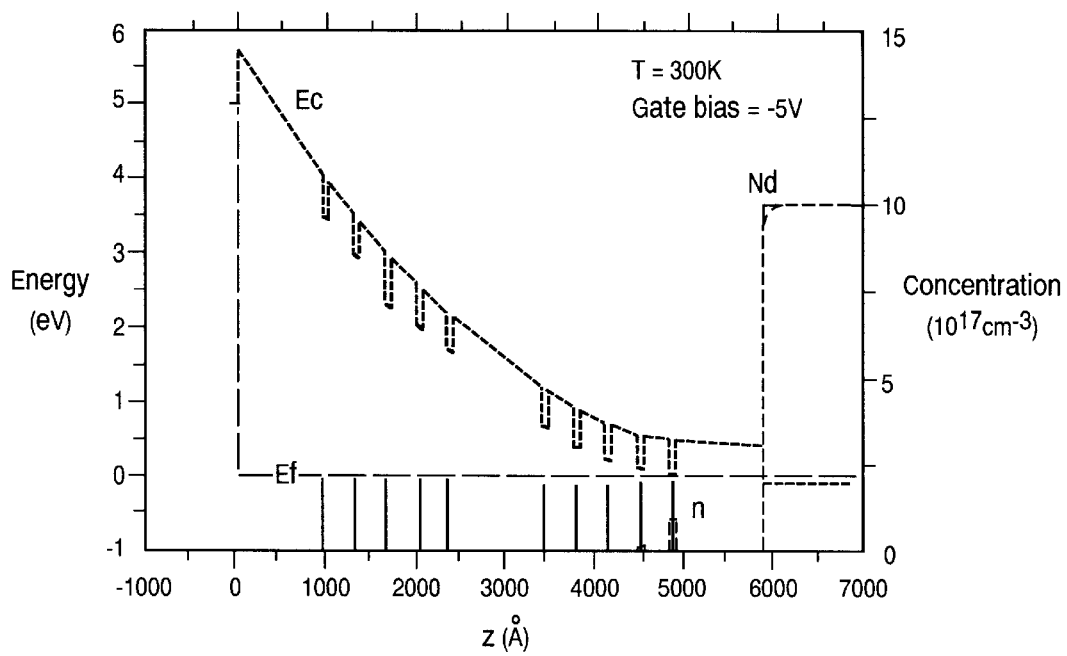
Figure 9F:
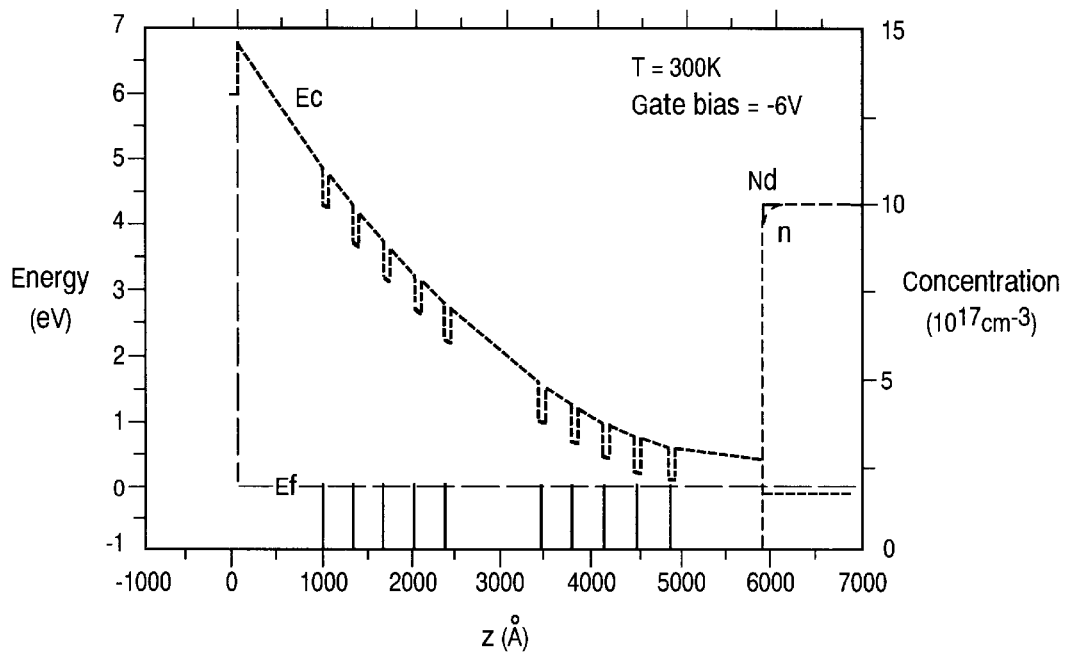
Figure 10A:
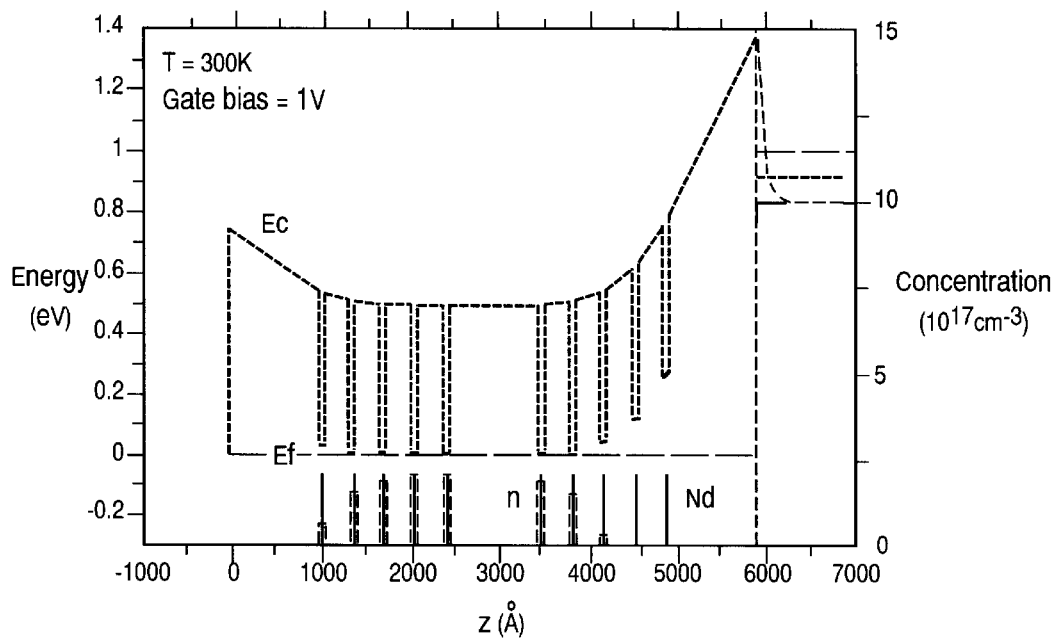
FIGS. 10a–e are band diagrams for various positive gate bias voltages illustrating the quantum well depletion
Figure 10B:
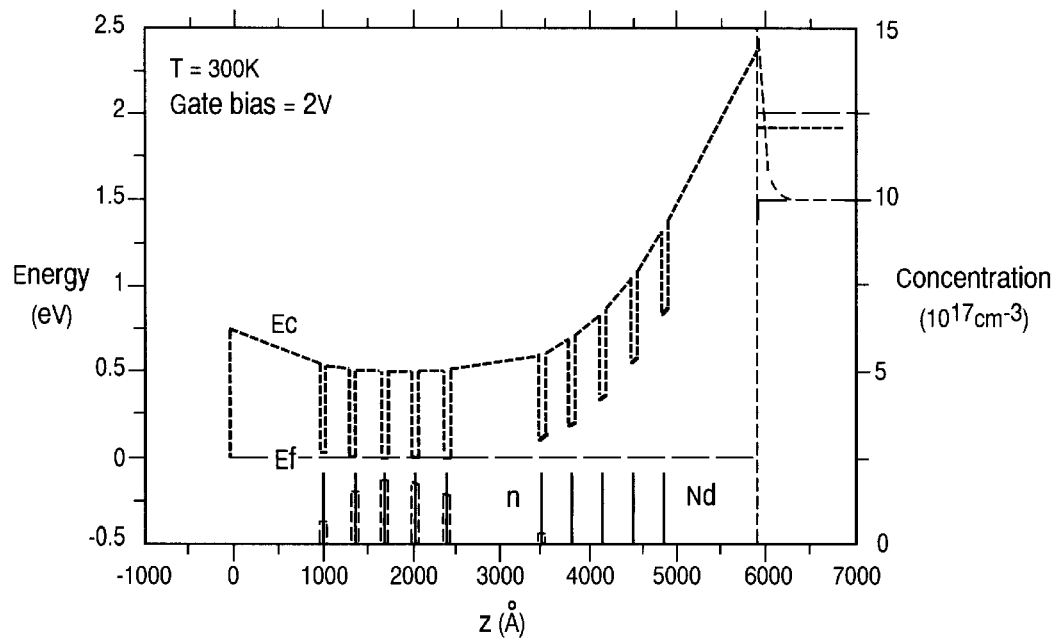
Figure 10C:
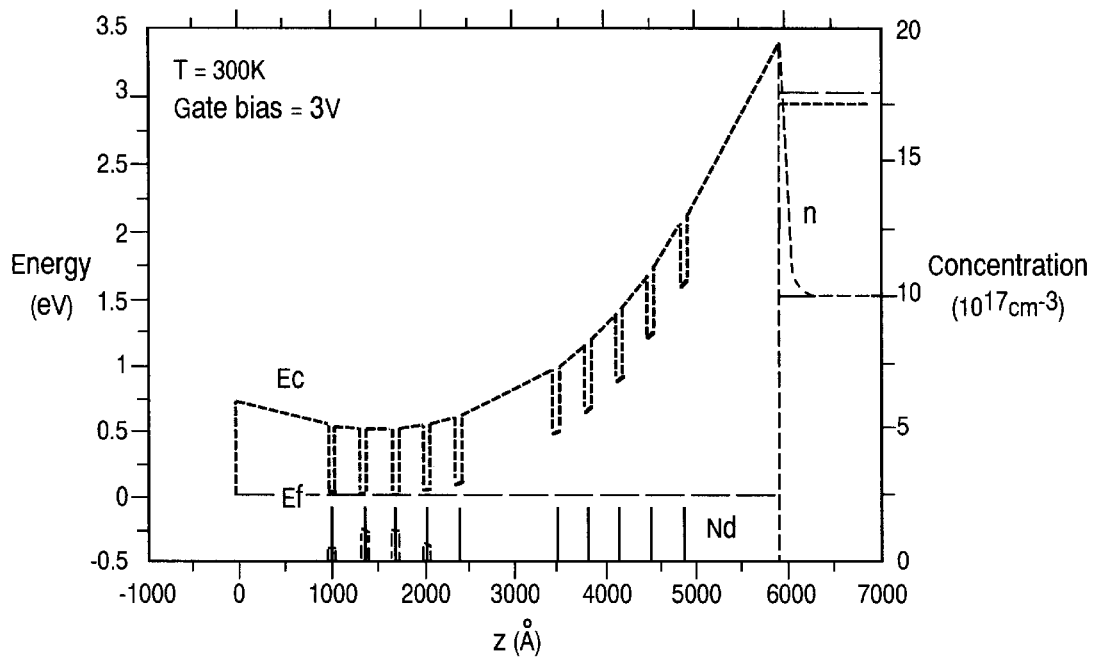
Figure 10D:
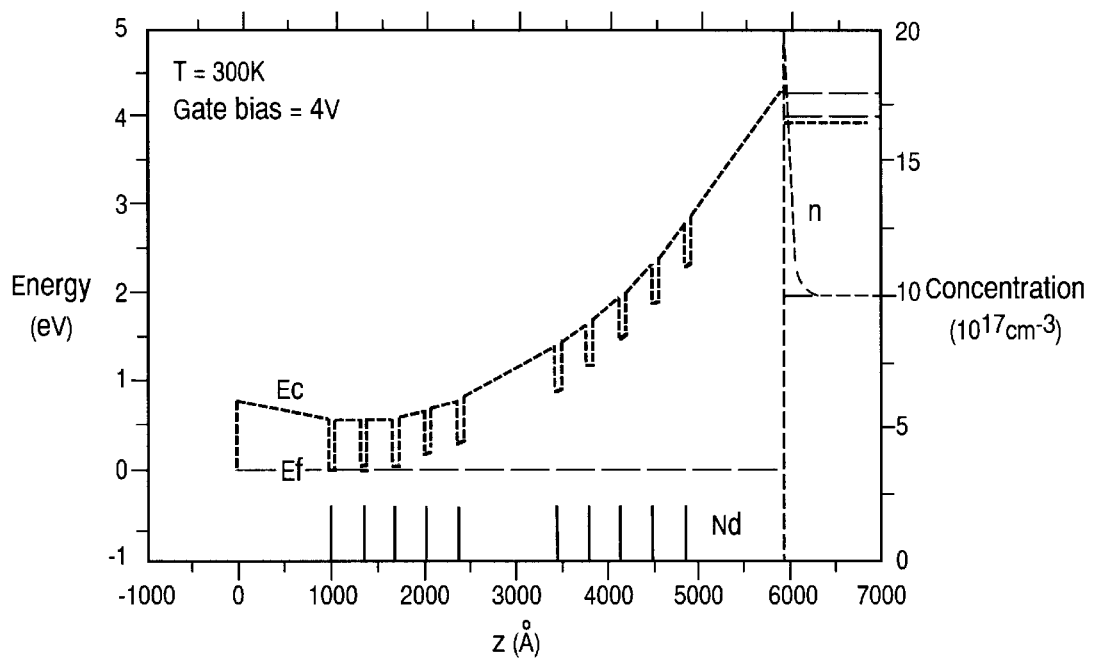
Figure 10E:
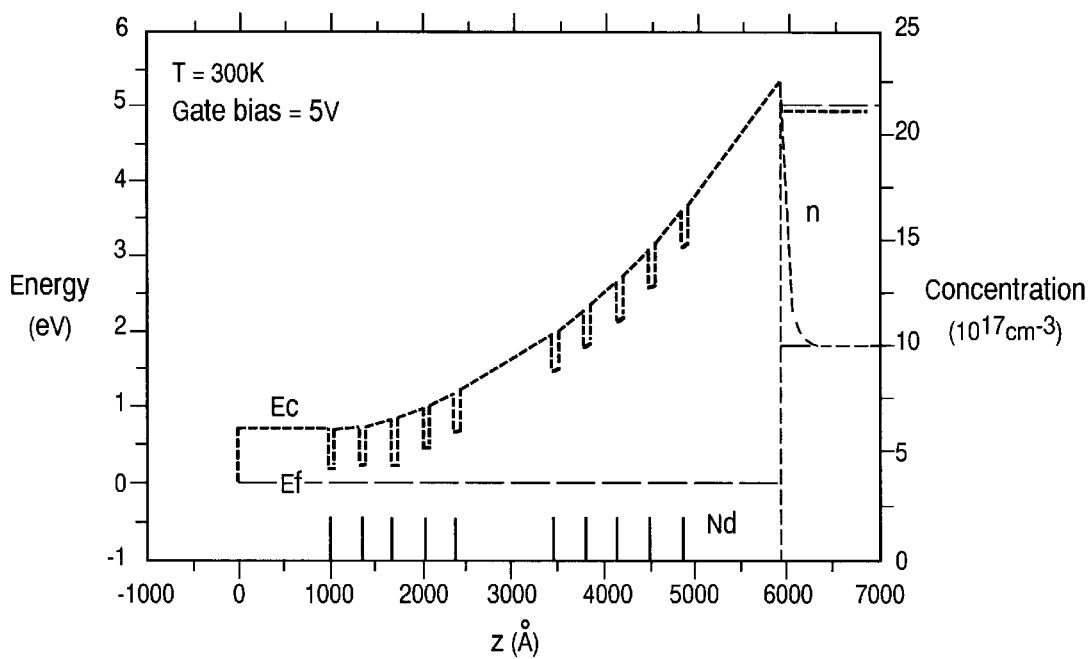

Full blown quantum mechanical modeling characteristics are demonstrated by FIG. 8. Five quantum wells for the 4.2 micron wavelength and five quantum wells for the 4.7 micron wavelength were used for the calculations, and the actual internal functionality of the device is characterized. The graph is shown as energy versus depth with a Gate Bias=0 volts, and includes the Fermi energy level Ef. The doping Nd 320 is shown for each well and represents the doping of the wells and contact layer. The electron distribution 330 is superimposed on the doping display line. In theory the electron density equals the doping density. However, as displayed, there is some surface effects that cause some depletion at 0 volts.

FIGS. 9a–9e depict the band diagrams for the modeled quantum well characteristics for gate bias voltages of −1, −2, −3, −4, −5 and −6 respectively. As shown the 4.2 micron wells are fully depleted at the gate bias=−2V. The 4.7 micron quantum wells are fully depleted at a gate bias=−6V. In-between the fully doped and fully depleted states, the quantum wells are able to have enough electrons to perform some level of absorption.

In order to provide steering in both directions, it is necessary to remove the absorption ability of the 4.7 micron quantum wells while preserving the 4.2 micron quantum wells. Referring to FIGS. 10a–10d, the band diagrams for the modeled quantum well characteristics for gate bias voltages of +1, +2, +3, +4, and +5 respectively. As shown the 4.7 micron wells are fully depleted at the gate bias=+2V. The 4.2 micron quantum wells are fully depleted at a gate-bias=+5V. In-between the fully doped and fully depleted states, the quantum wells are able to have enough electrons to perform some level of absorption.

Figure 11C:
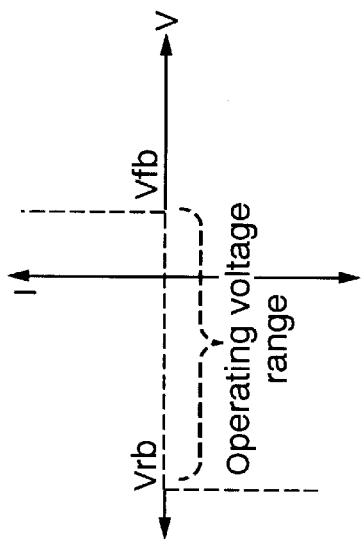
FIGS. 11a–c show the forward diode breakdown properties of the Shottky diode
Figure 11B:
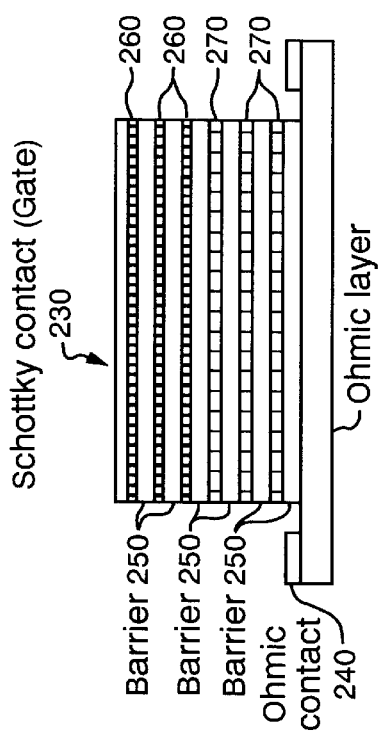
Figure 11A:
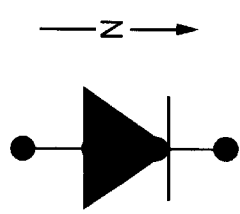

One of the problems with the forward biasing is the forward diode breakdown problem of the Schottky diode, which is illustrated in FIGS. 11a–11c. It is well known that the operating voltage range of a Schottky diode is from Vrb to Vfb. The forward bias value (Vfb) is of lesser amplitude than the negative biasing. Thus, when applying the forward bias voltage, the breakdown voltage could limit the ability to fully deplete the wells as required for optimal steering.

One scheme to extend the forward bias is to employ a Schottky Back Gate as shown in FIGS. 12a–12c. The standard Schottky-diode is designed to include an insulating layer 620 between the ohmic layer (back gate) 410 and the 4.7 micron quantum wells 270. The insulating layer is approximately 1000 Angstroms in width and in one embodiment is a layer of low temperature GaAs. In this configuration, the voltage bias is applied to both the fromt gate 400 and the back gate 410 to effect the quantum wells electronic distribution. The positive voltage feedback (Vfb) is extended and the entire operating voltage range is available for operations.

Figure 13:
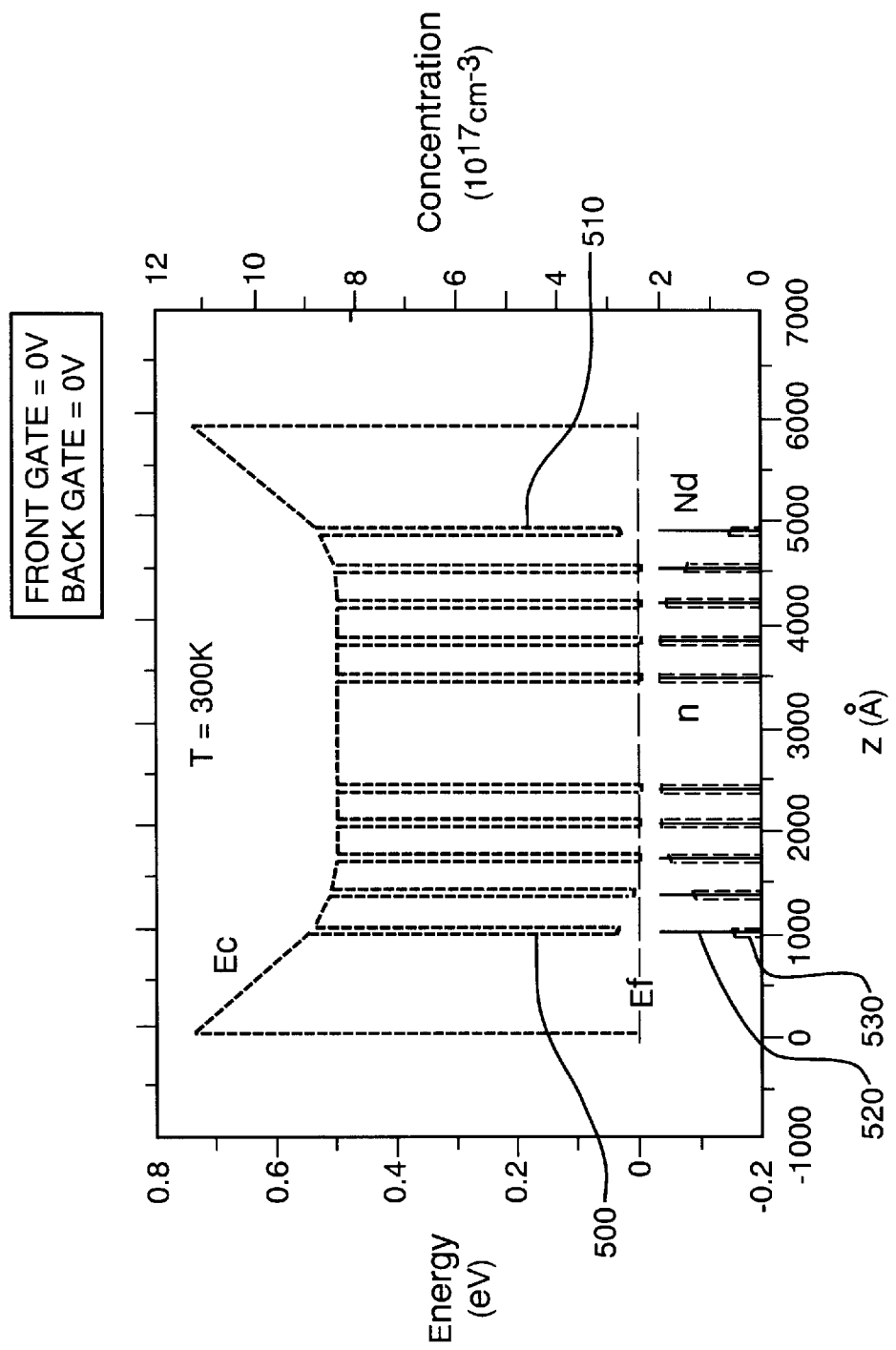
FIG. 13 is an exploded graphical depiction of a band diagram with a gate bias=0 volts showing the energy level (eV) versus depth of the device with the back-to-back Shottky diodes and the effect of the extended forward breakdown voltage
Figure 14A:
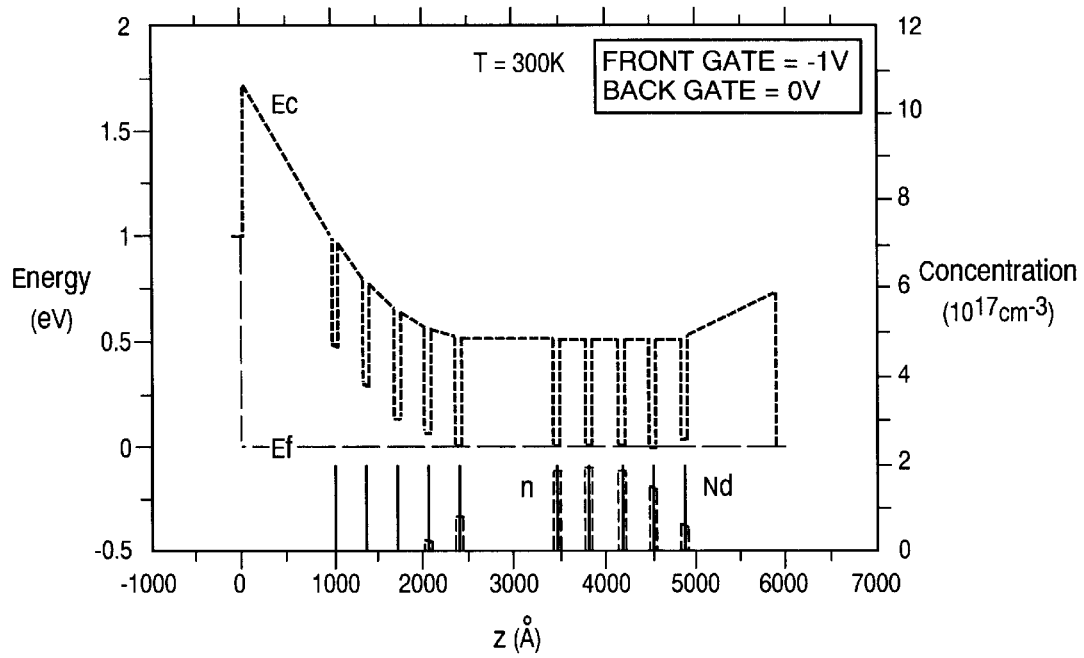
FIGS. 14a–f are band diagrams for various negative front gate bias voltages illustrating the quantum well depletion with the back gate voltage=0
Figure 14B:
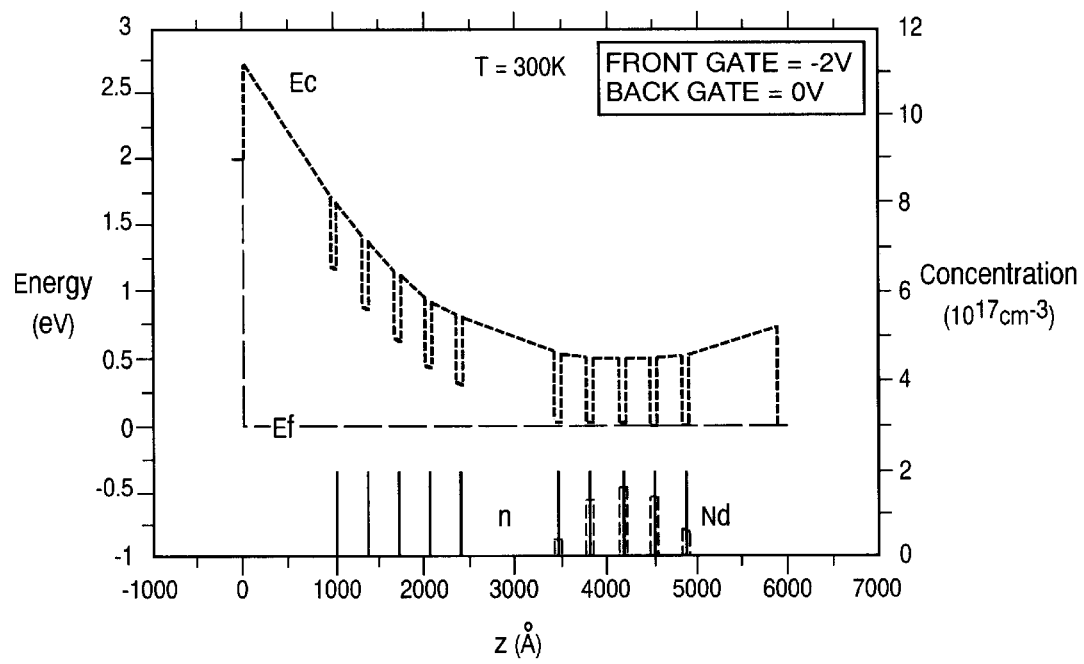
Figure 14C:
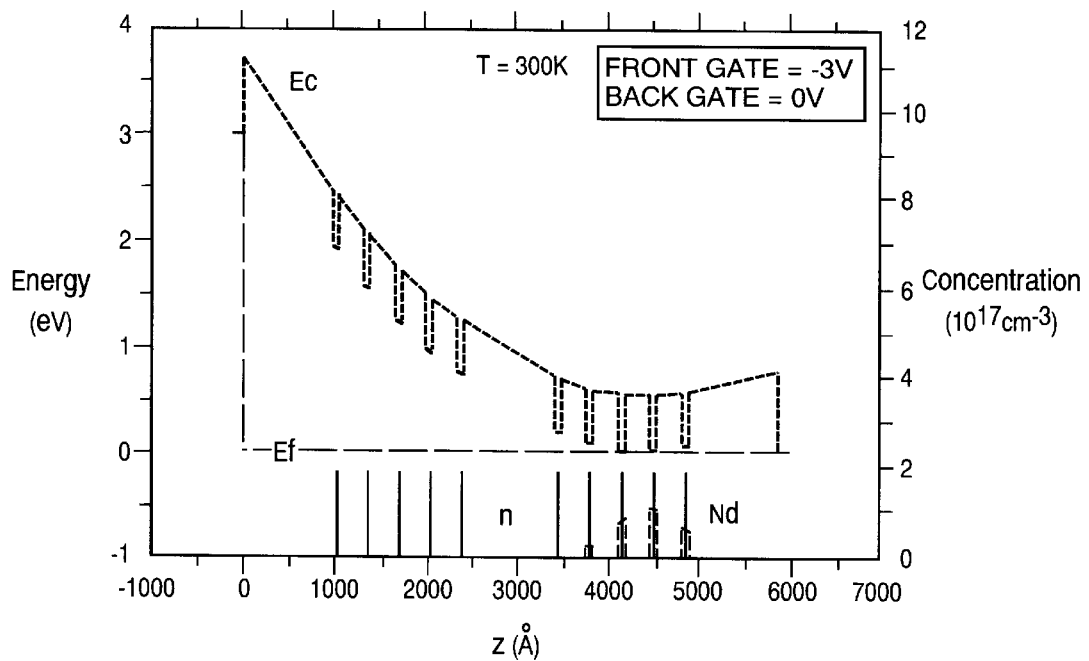
Figure 14D:
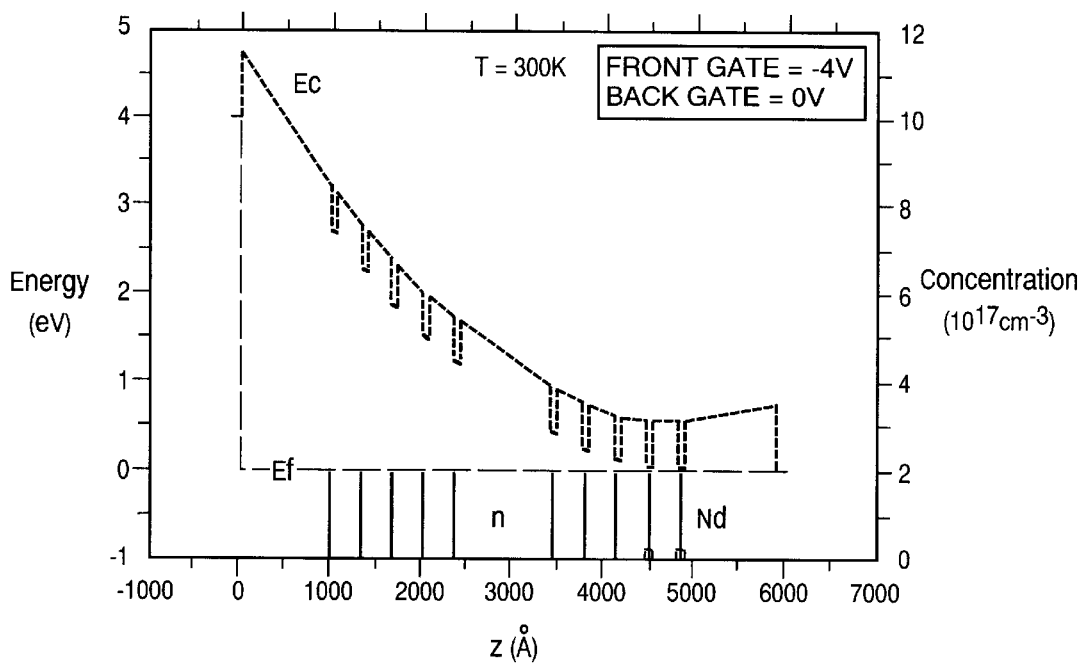
Figure 14E:
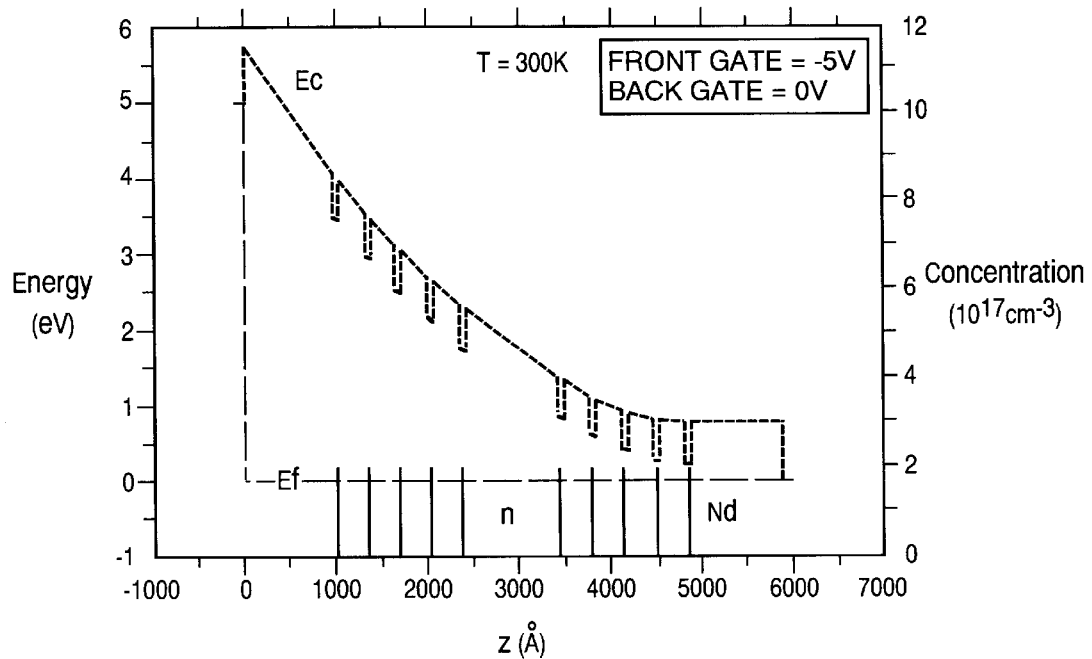
Figure 14F:
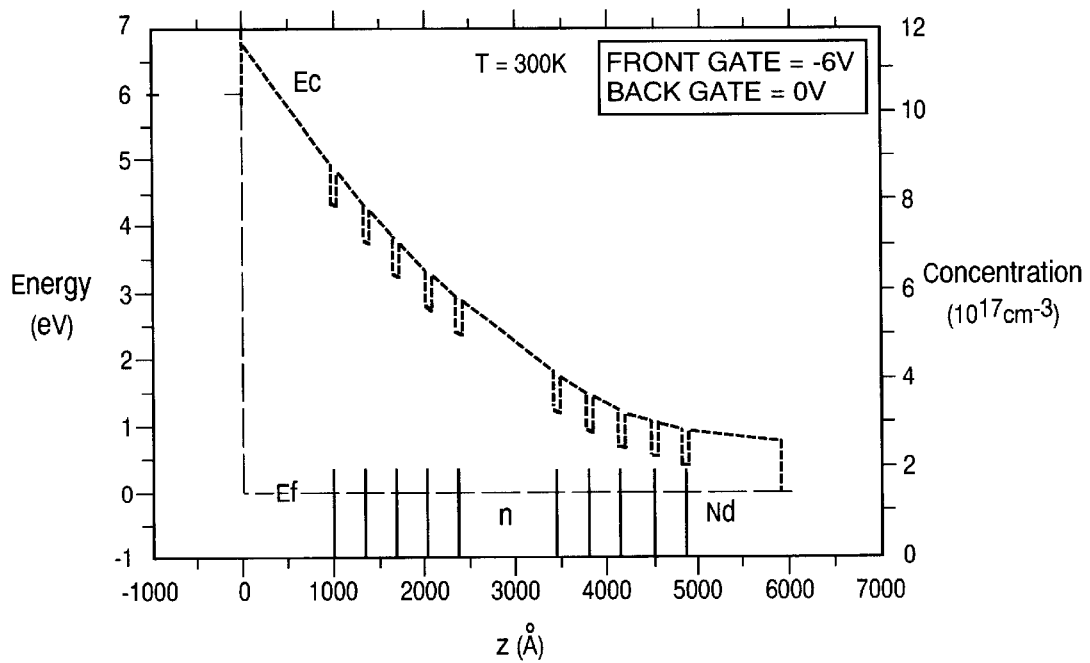
Figure 15A:
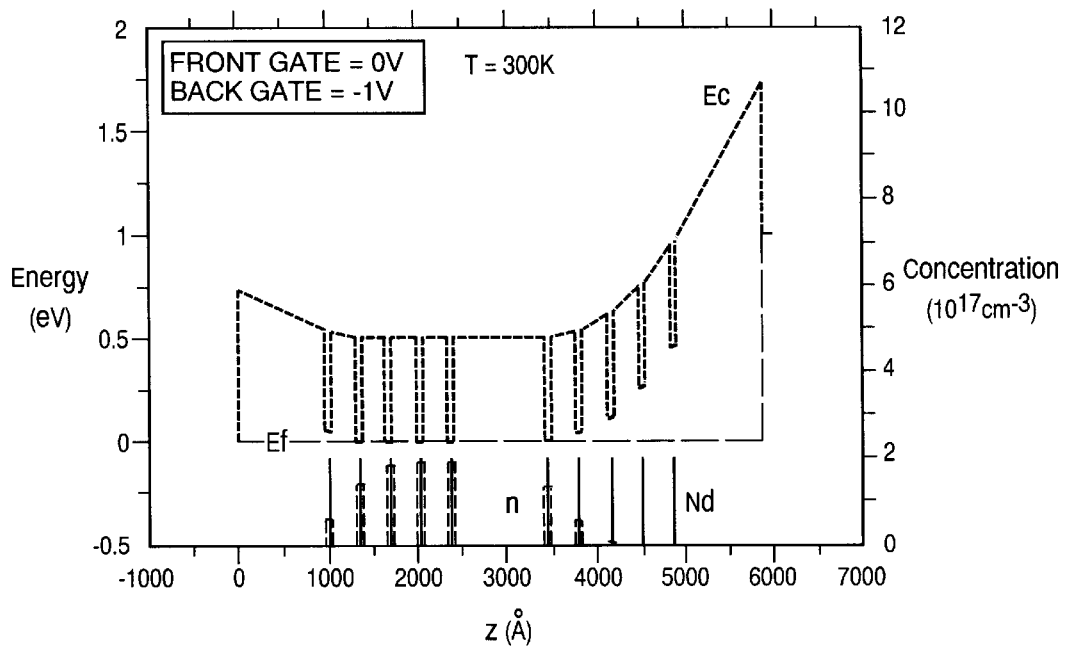
FIGS. 15a–f are band diagrams for various negative back gate bias voltages illustrating the quantum well depletion with the front gate voltage=0
Figure 15B:
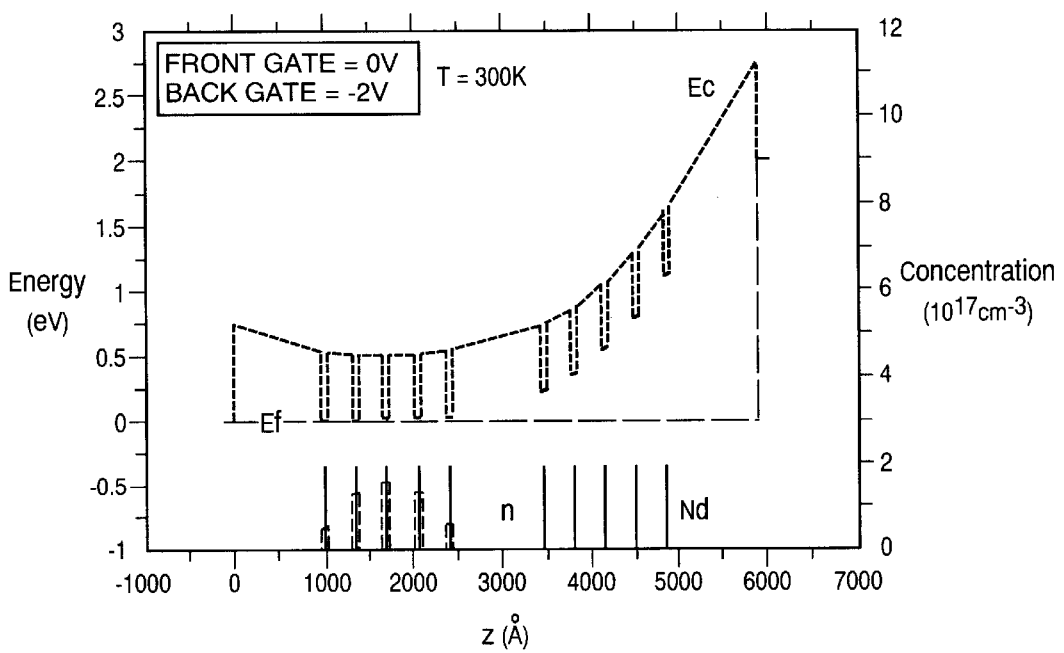
Figure 15C:
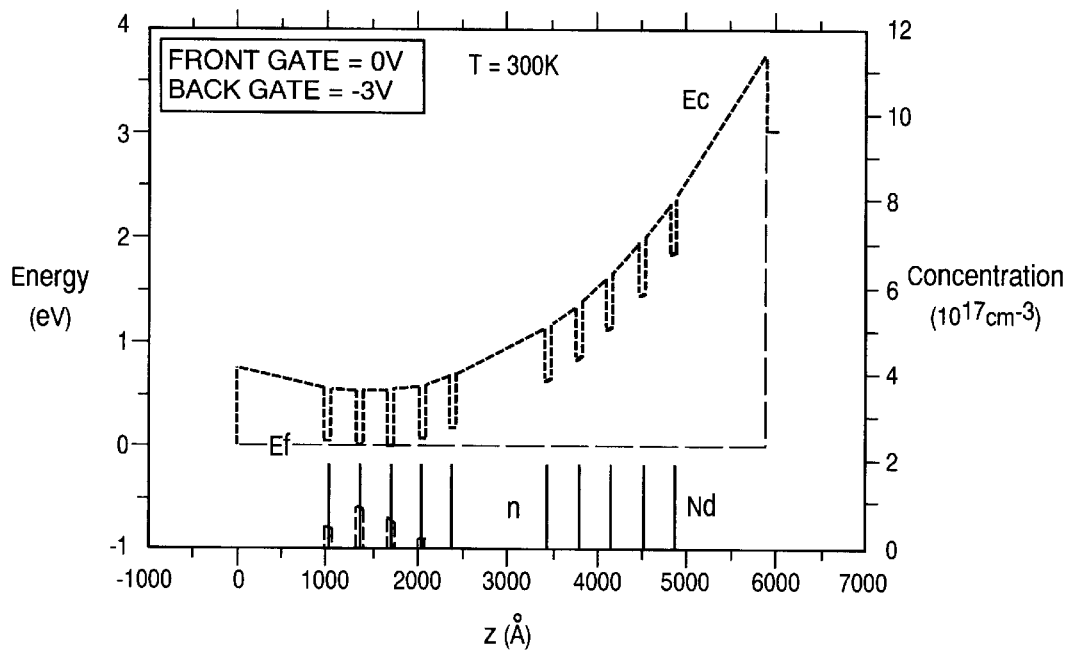
Figure 15D:
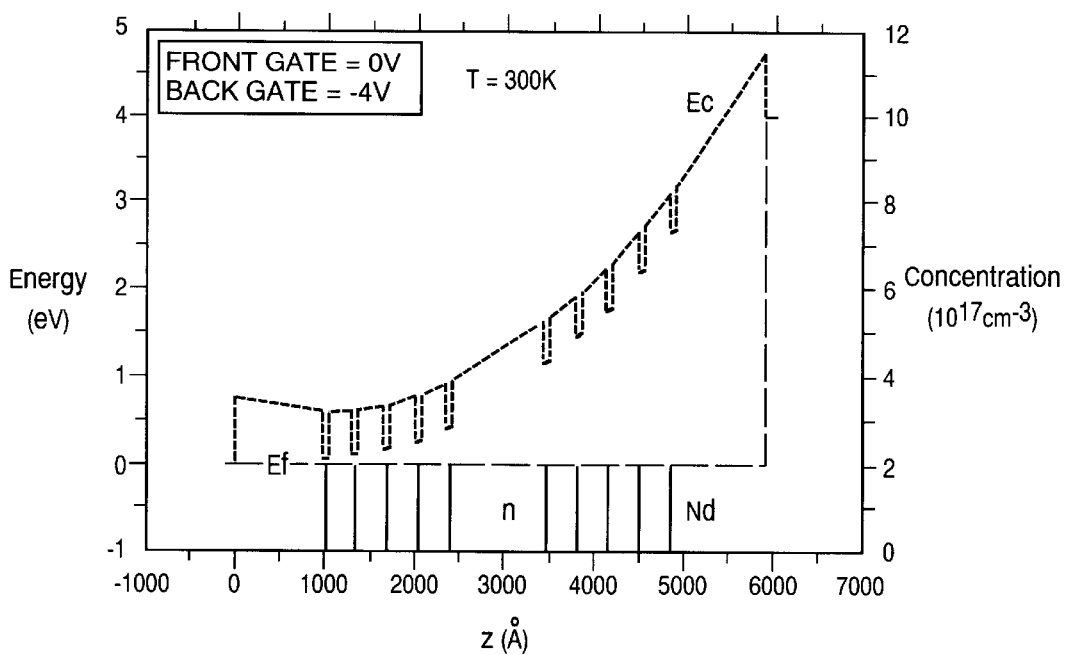
Figure 15E:
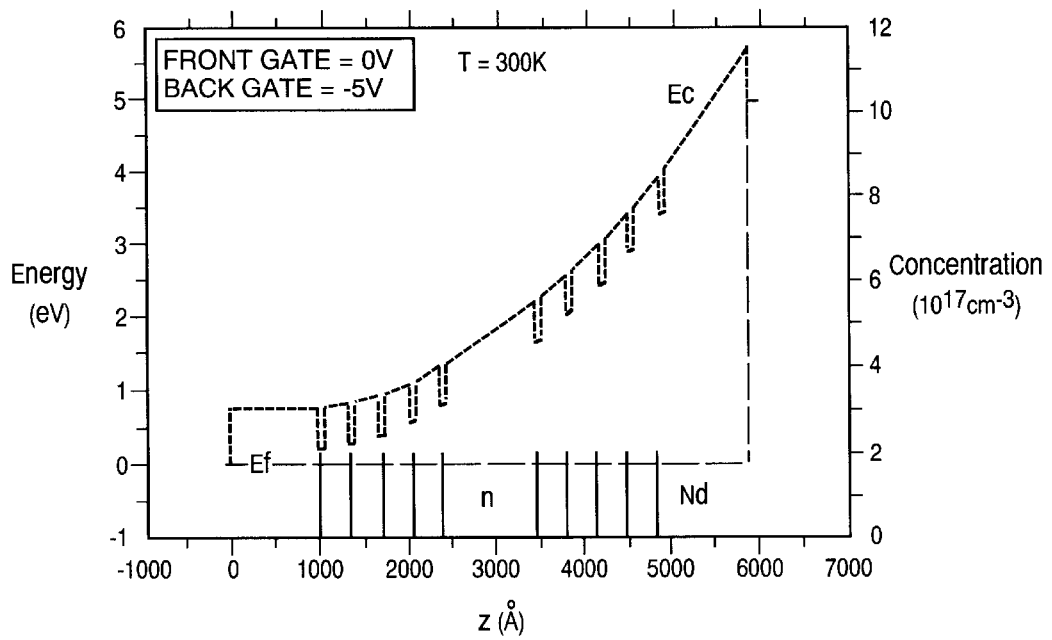
Figure 15F:
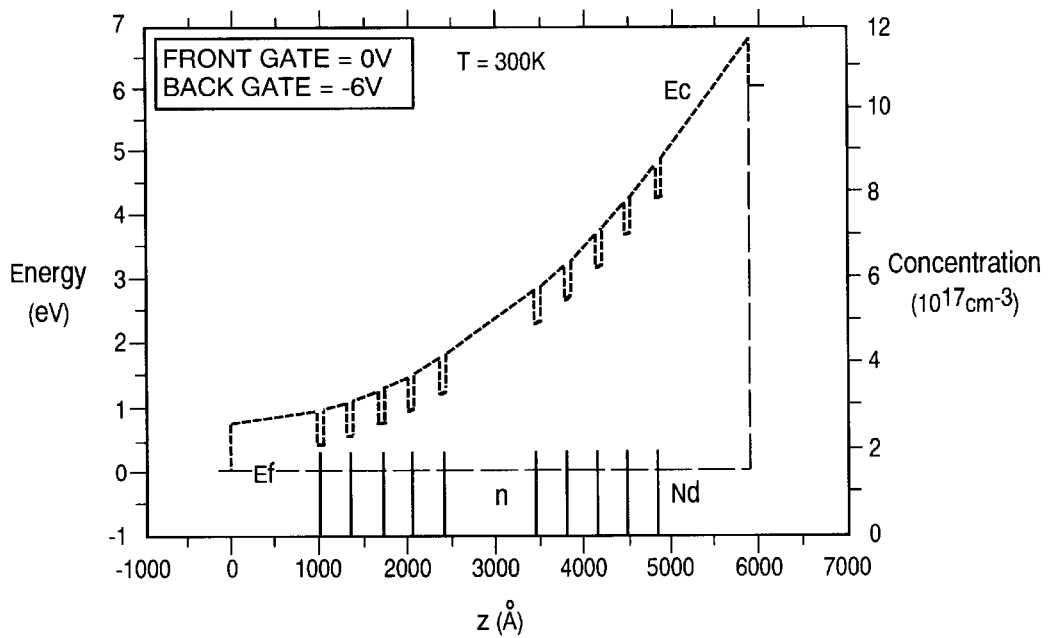

Referring to FIG. 13, the modeling illustrates that for the five 4.2 micron quantum wells 500 and the 4.7 micron quantum wells 510 have an electron distribution that is controllable from both directions. With a front gate and back gate=0 volts, the doping 520 is shown along with the superimposed electron distribution 530 for each of the wells for each of the quantum wells 500, 510.

The quantum well depletion of the various 4.2 micron wells 500 and the 4.7 micron wells is shown in FIGS. 14a–14f commencing with the 4.2 micron wells and extending to the 4.7 micron wells as the front gate voltage bias increases from −1 volts to −6 volts with the back gate voltage held at 0 volts.

The reverse situation is shown in FIGS. 15a–15f, wherein the 4.7 micron wells 510 are first depleted and then the 4.2 micron wells 500 by applying a negative back gate voltage that varies from −1 volts to 4 volts with the front gate voltage=0 volts.

Figure 16:
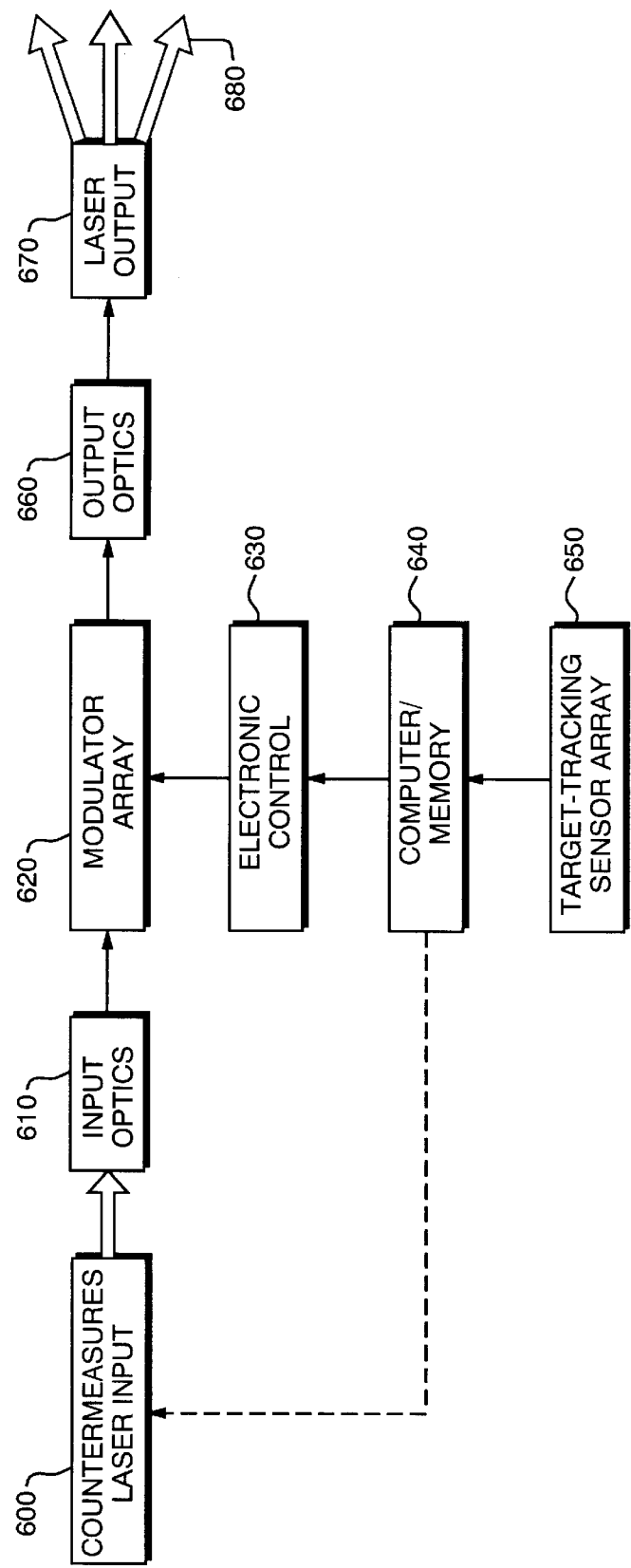
FIG. 16 is a block diagrammatic perspective of electronic countermeasures application

An embodiment of the electronic countermeasures application cited herein is shown in FIG. 16, wherein the countermeasures laser input 600 is optically coupled by some input optics 610 and directed to a modulator array 620. The modulator array 620 has a plurality of absorption modulators (not shown) that are steerable by the applied voltage patterns from the electronic control 630. The electronic control 630 sends the voltage pattern to the drive circuitry of the substrate interconnecting to the modulator array 620. The computer/memory section 640 is used for calculating the voltage pattern to be applied in order to blind the optical sensors of the threat, such as a missile or aircraft. An optional connection between the laser input 600 and the computer section 640 allows for additional processing capabilities. The target-tracking sensor array 650 may be coupled to the computer/memory section 640 to provide the necessary information for the steering calculations and confirm when the threat has been properly blinded. The beam steered optical output from the modulator array 620 is coupled to some optics 660 and the transmitted laser output 680 is transmitted from the laser output section 670.

Figure 17:
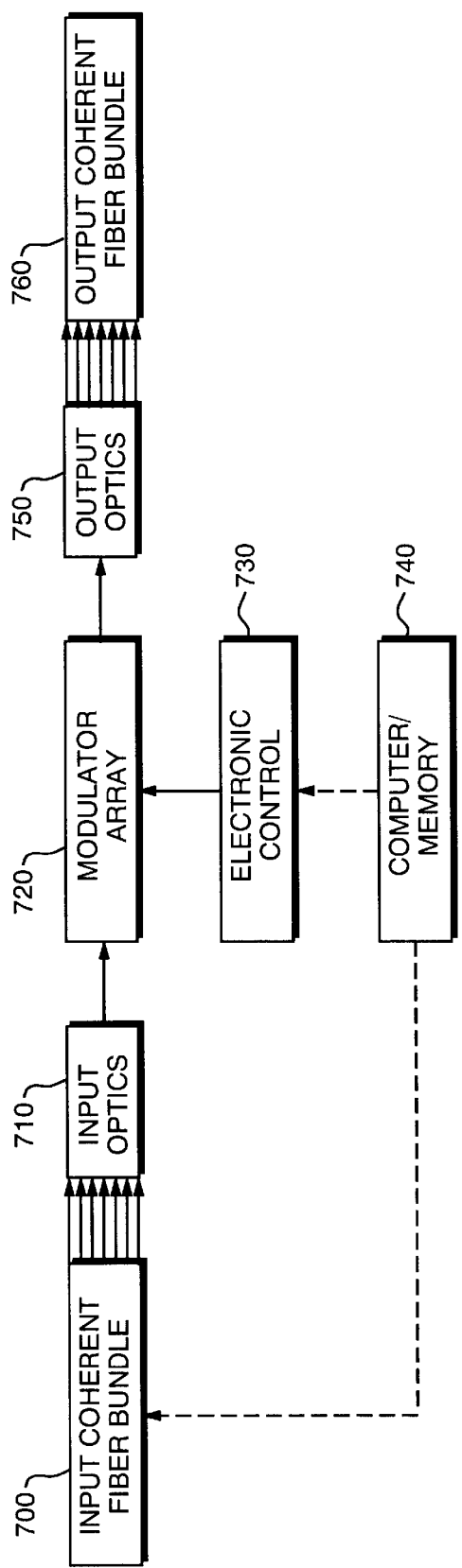
FIG. 17 is a block diagrammatic perspective of a telecommunications application for optical to optical communications

Referring to FIG. 17, a simplified telecom application is illustrated wherein a coherent fiber bundle 700 is the input light source to some input optics 710. The light beams from the input optics is directed to the modulator array 720 in which the individual optical absorption modulators (not shown) are controlled by the electronic control section 730 that applies the bias voltages. The electronic control section 730 interconnects to some processing and memory sections 740 such as a microcontroller that is used to perform the dynamic calculations for the applied voltage patterns or to issue a stored voltage pattern from memory. The beam steered output of the modulator array 720 goes through some form of optical coupling 750 which directs the light signals to an output coherent fiber bundle 760. It should be readily apparent that the present invention is adaptable to multiple variations where steering would benefit the light communications.

Figure 18:
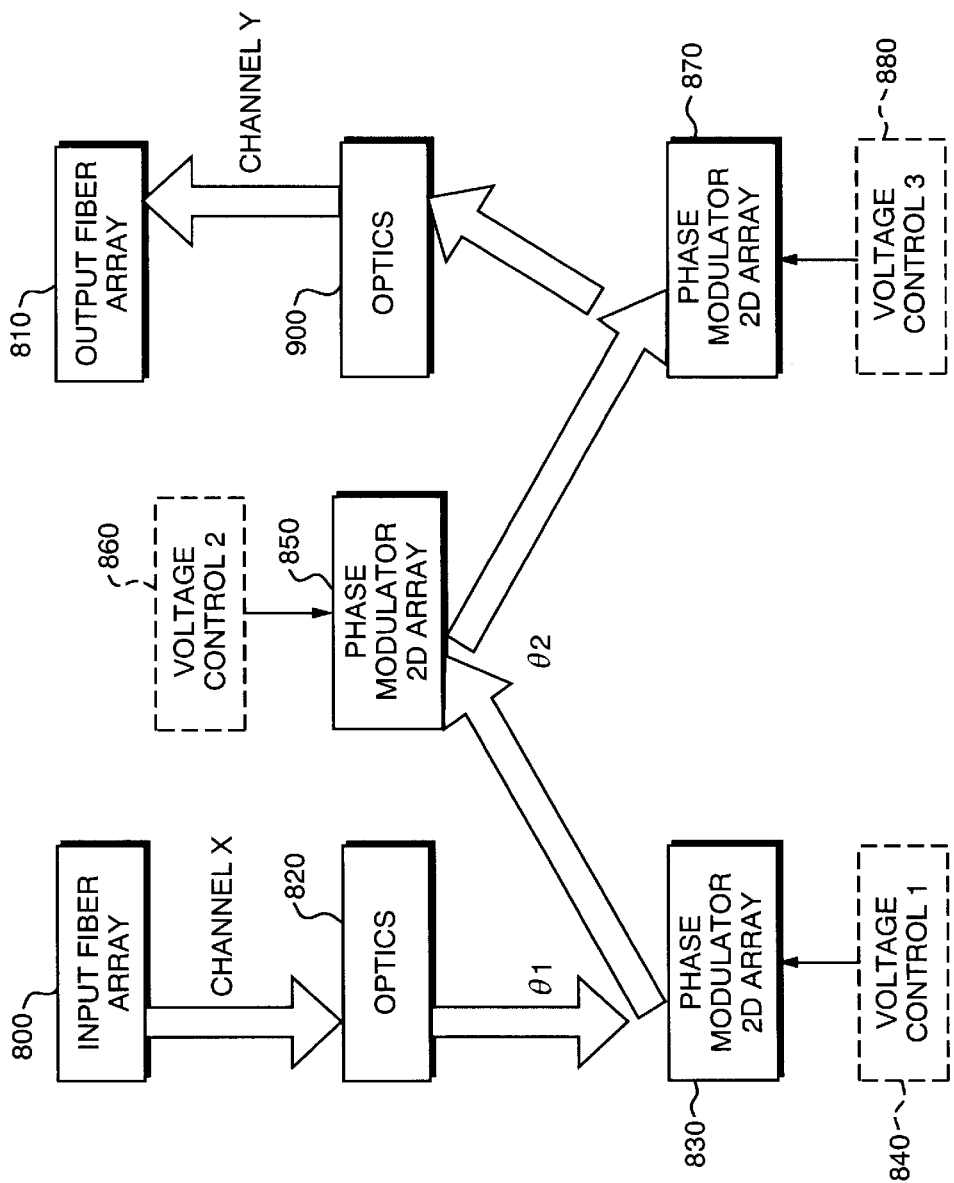
FIG. 18 is a block diagrammatic perspective of an optical switching using a two dimensional array with multiple modulator arrays

FIG. 18 illustrates one embodiment for an optical switching application, such as a crossbar switch, with an input fiber array 800 coupled to an optical device 820 such as an optical coupler. The light is transmitted to the two dimensional phase modulator 830 that is controlled by a voltage control unit 840 to steer the light beams. The light beams can be directed to a second two dimensional phase modulator 860 that can have a second voltage control unit 860 to control the absorption modulators of the array. These signals are directed to a third two dimensional phase modulator array 870 with a voltage control unit 880. The resulting output light beams are steered to an optical coupling unit 900 which directs the light signals to an output fiber array. In this manner, the switching is completely optical without optoelectronic conversions. The beams can be steered by each of the arrays to shift the angle of the output light beams thus providing greater flexibility to the operator. The photonic cross bar switch of the prior art accomplishes the aforementioned functionality but used optoelectronic conversions and related delays and inefficiencies.

It should be noted that reference to the laser beam steering system in the noted preferred embodiments is not intended as a limitation to the various implementations or applications permitted. Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. A laser beam steering device to steer an infrared laser beam, comprising:
at least one optical absorption modulator formed on a substrate and having a quantum well doped with electrons, said laser beam being incident on said modulator, wherein discrete voltage signals applied to said modulator control an exit angle of one or more exit beams from said modulator, and wherein said modulator operates using intersubband transitions in said quantum wells.

2. The optical beam steering device according to claim 1, wherein said substrate is an application specific integrated circuit (ASIC) with integrated drive circuitry electrically coupled to said modulator.

3. The optical beam steering device according to claim 1, wherein said at least one modulator is formed as a one dimensional array of modulators.

4. The optical beam steering device according to claim 1, wherein said at least one modulator is formed as a two dimensional array of modulators.

5. The optical beam steering device according to claim 1, further comprising a second set of at least one modulator wherein said one or more beams are incident upon said second set of at least one modulator.

6. The optical beam steering device according to claim 1, wherein said at least one modulator forms a transmission array wherein said laser beam travels through said transmission array.

7. The optical beam steering device according to claim 1, wherein said at least one modulator forms a reflection array wherein said laser beam is at least partially reflected from said reflection array.

8. The optical beam steering device according to claim 1, further comprising a microcontroller coupled to said modulator for processing said voltage signals.

9. The optical beam steering device according to claim 8, further comprising a memory section coupled to said microcontroller and wherein said memory section applies a stored voltage pattern to said at least one modulator.

10. The optical beam steering device according to claim 1, wherein said voltage signals are applied in a voltage pattern to amplitude modulate said at least one modulator.

11. The optical beam steering device according to claim 1, wherein said voltage signals are applied in a voltage gradient to phase modulate said at least one modulator.

12. The optical beam steering device according to claim 1, wherein said at least one modulator is formed as a Shottky diode.

13. The optical beam steering device according to claim 12, wherein said Shottky diode further comprises a back gate.

14. An electrically steerable laser system for countermeasures, comprising:
- an input laser signal;
- an array of optical absorption modulators;
- at least one input optical device coupling said laser signal to said optical modulators;
- an electronic control section for producing a voltage pattern to said modulators, wherein said voltage pattern operates in an intersubband transition to steer said input laser signal and produce a steered laser beam; and
- at least one output optical device coupled to said array and outputting said steered laser beam.

15. The electrically steerable laser system according to claim 14, further comprising a target tracking sensor array coupled to said electronic control section.

16. An all optical switching system, comprising:
- an input fiber optic bundle having input optic signals;
- an array of optical absorption modulators;
- at least one input optical device coupling said input optic signals to said optical modulators;
- an electronic control section for producing a voltage pattern to said modulators, wherein said voltage pattern operates in an intersubband transition to steer said input optic signals and produce a steered optical output;
- an output fiber optic bundle having output optic signals; and
- at least one output optical device coupled to said array and said output fiber optic bundle.

* * * * *